(12) United States Patent
Aketa et al.

(10) Patent No.: US 10,109,749 B2
(45) Date of Patent: *Oct. 23, 2018

(54) SEMICONDUCTOR DEVICE AND SEMICONDUCTOR DEVICE MANUFACTURING METHOD

(71) Applicant: ROHM CO., LTD., Kyoto-shi, Kyoto (JP)

(72) Inventors: Masatoshi Aketa, Kyoto (JP); Yoshikatsu Miura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/839,103

(22) Filed: Dec. 12, 2017

(65) Prior Publication Data
US 2018/0114868 A1 Apr. 26, 2018

Related U.S. Application Data

(63) Continuation of application No. 15/308,953, filed as application No. PCT/JP2015/063520 on May 11, 2015, now Pat. No. 9,876,124.

(30) Foreign Application Priority Data

May 12, 2014 (JP) .................. 2014-098911

(51) Int. Cl.
*H01L 29/872* (2006.01)
*H01L 29/06* (2006.01)
(Continued)

(52) U.S. Cl.
CPC .... *H01L 29/8725* (2013.01); *H01L 21/02529* (2013.01); *H01L 29/0619* (2013.01);
(Continued)

(58) Field of Classification Search
CPC . H01L 29/8725; H01L 29/06; H01L 29/1608; H01L 29/36; H01L 29/47;
(Continued)

(56) References Cited

U.S. PATENT DOCUMENTS

2004/0056306 A1 3/2004 Saito et al.
2006/0138536 A1 6/2006 Kouzuki et al.
(Continued)

FOREIGN PATENT DOCUMENTS

JP 2000269518 A 9/2000
JP 2004119611 A 4/2004
(Continued)

OTHER PUBLICATIONS

International Search Report issued for International Patent Application No. PCT/JP2015/063520, dated Jul. 28, 2015, 6 pages including English translation.
(Continued)

*Primary Examiner* — Cuong Q Nguyen
*Assistant Examiner* — Tong-Ho Kim
(74) *Attorney, Agent, or Firm* — Hamre, Schumann, Mueller & Larson, P.C.

(57) ABSTRACT

This semiconductor device includes: a semiconductor layer that is formed of first conductivity-type SiC; a plurality of trenches that are formed in the semiconductor layer; second conductivity-type column regions that are formed along the inner surfaces of the trenches; a first conductivity-type column region that is disposed between the adjacent second conductivity-type column regions; and insulating films that are embedded in the trenches. The semiconductor device is capable of improving a withstand voltage by means of a super junction structure. The semiconductor device may also include an electric field attenuation section for attenuating
(Continued)

electric field intensity of a surface section of the first conductivity-type column region.

13 Claims, 25 Drawing Sheets

(51) Int. Cl.
  *H01L 29/66* (2006.01)
  *H01L 29/47* (2006.01)
  *H01L 29/16* (2006.01)
  *H01L 29/36* (2006.01)
  *H01L 21/02* (2006.01)

(52) U.S. Cl.
  CPC .......... *H01L 29/1608* (2013.01); *H01L 29/47* (2013.01); *H01L 29/6606* (2013.01); *H01L 29/66143* (2013.01); *H01L 29/872* (2013.01); H01L 29/0649 (2013.01); H01L 29/36 (2013.01)

(58) Field of Classification Search
  CPC ............. H01L 29/66143; H01L 29/872; H01L 21/02529; H01L 29/0619; H01L 29/6606
  USPC .................................................. 257/77, 330
  See application file for complete search history.

(56) References Cited

U.S. PATENT DOCUMENTS

| 2007/0120201 | A1 | 5/2007 | Yamaguchi et al. |
| 2009/0179298 | A1 | 7/2009 | Cheng |
| 2009/0289262 | A1 | 11/2009 | Zhang et al. |
| 2012/0273802 | A1 | 11/2012 | Zhang et al. |
| 2014/0077228 | A1 | 3/2014 | Zhang et al. |

FOREIGN PATENT DOCUMENTS

| JP | 2006186145 | A |   | 7/2006 |
| JP | 2007042997 | A | * | 2/2007 |
| JP | 2007042997 | A |   | 2/2007 |
| JP | 2007173783 | A |   | 7/2007 |
| JP | 2008258313 | A |   | 10/2008 |
| JP | 2011521471 | A |   | 7/2011 |
| WO | 2013161116 | A1 |  | 10/2013 |

OTHER PUBLICATIONS

International Preliminary Report on Patentability issued for International Patent Application No. PCT/JP2015/063520, dated Nov. 24, 2016, 13 pages including English translation.

Office Action issued for Japanese Patent Application No. 2014-098911, dated Mar. 1, 2018, 6 pages including English translation.

* cited by examiner

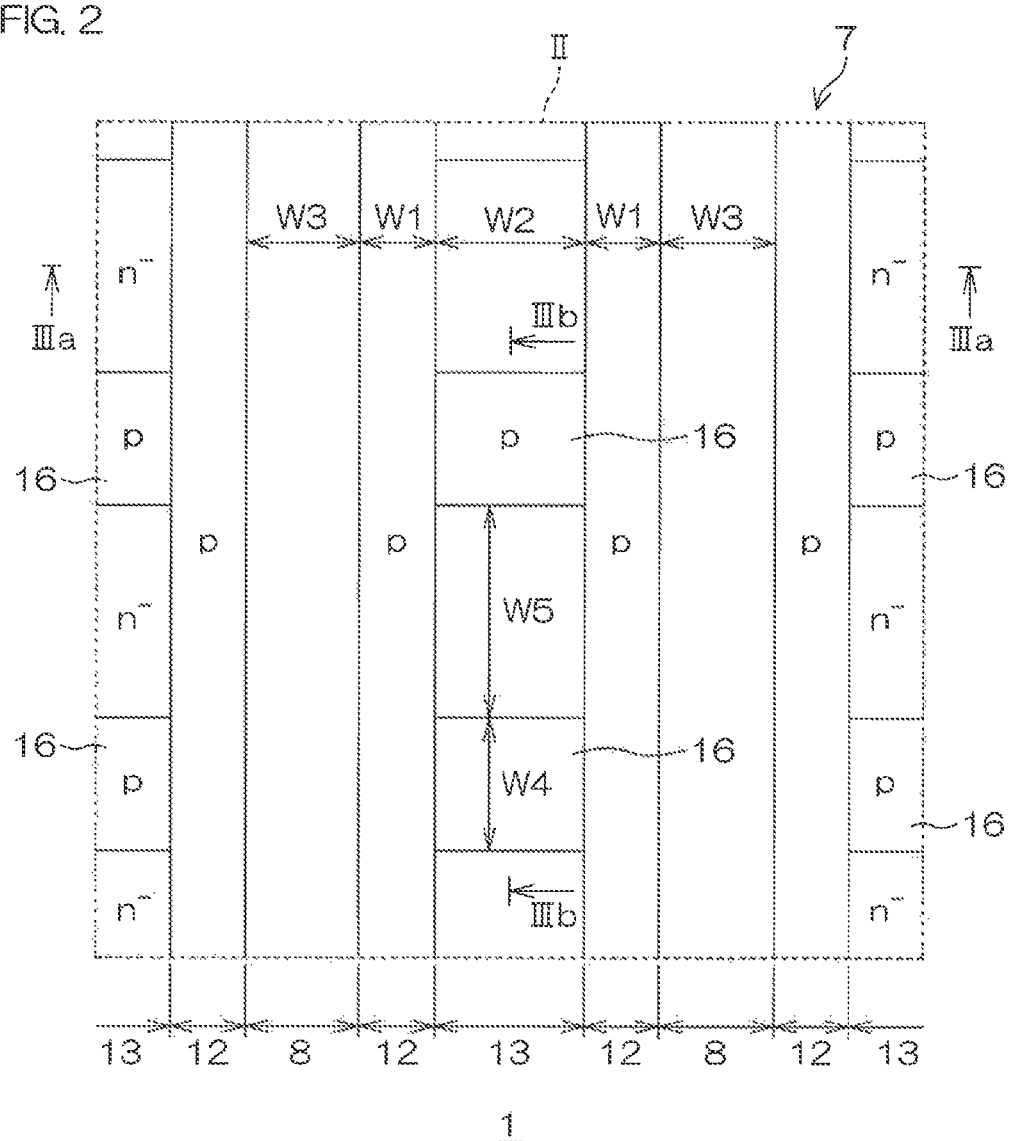

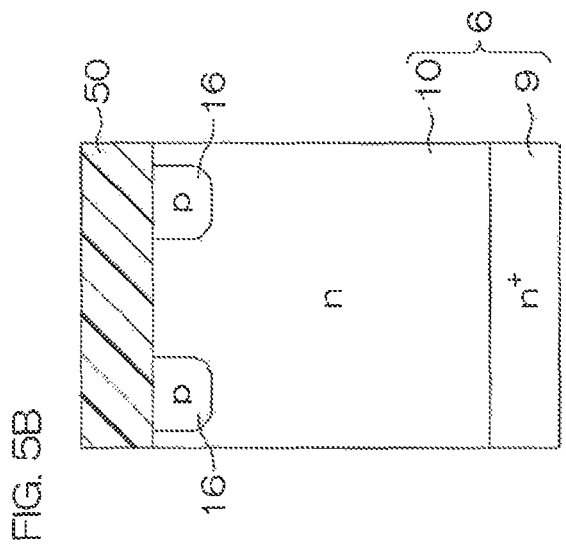
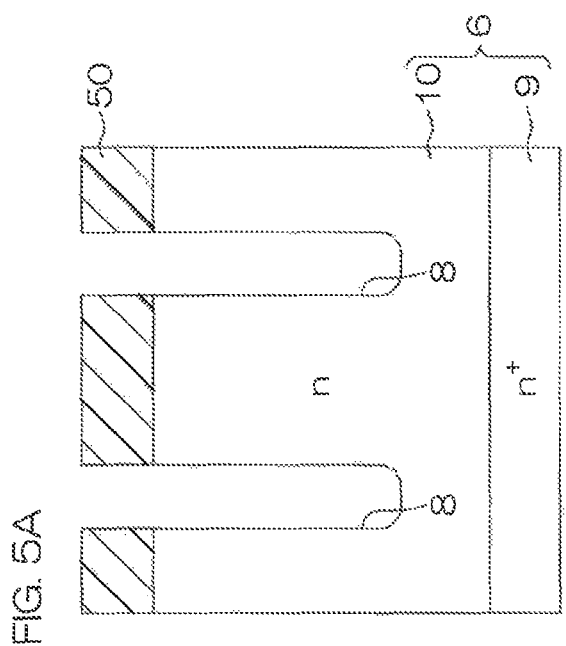

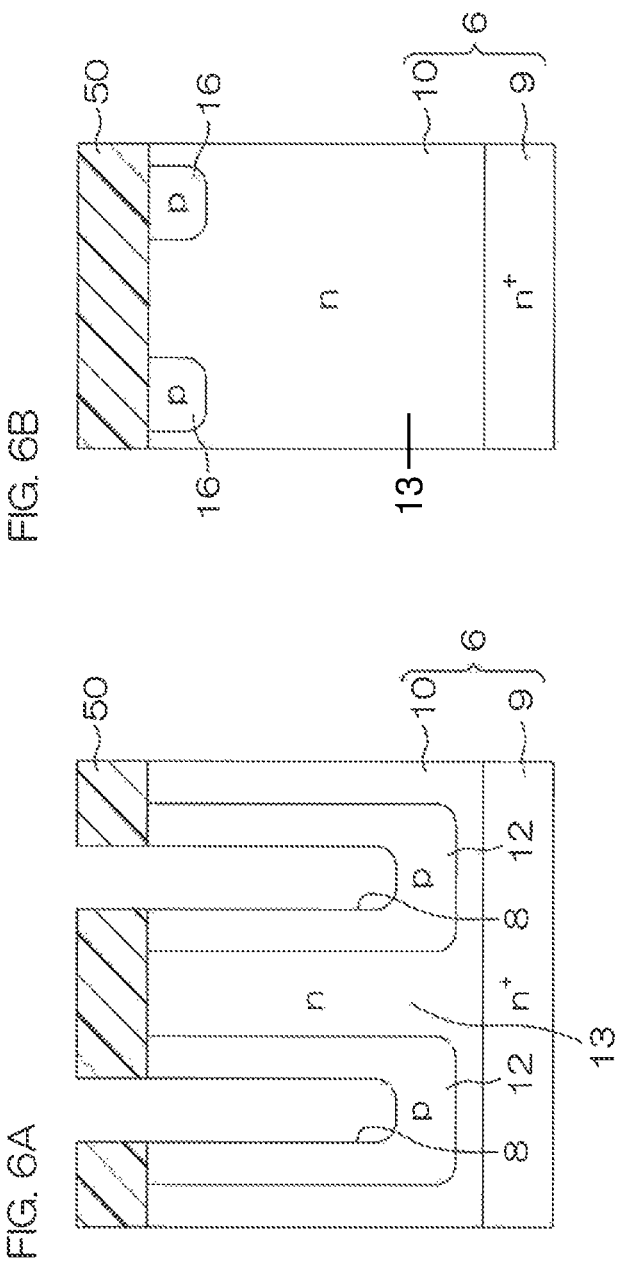

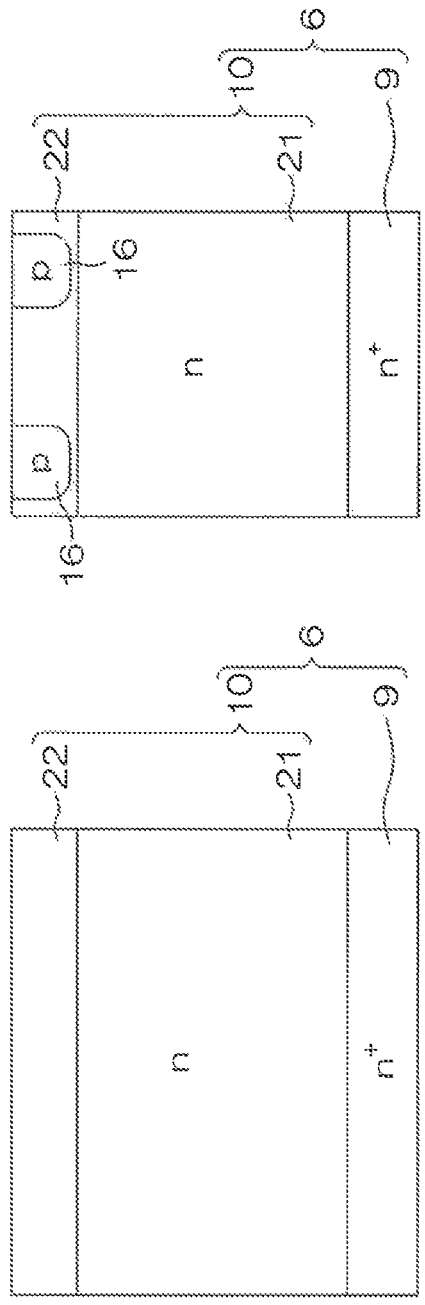

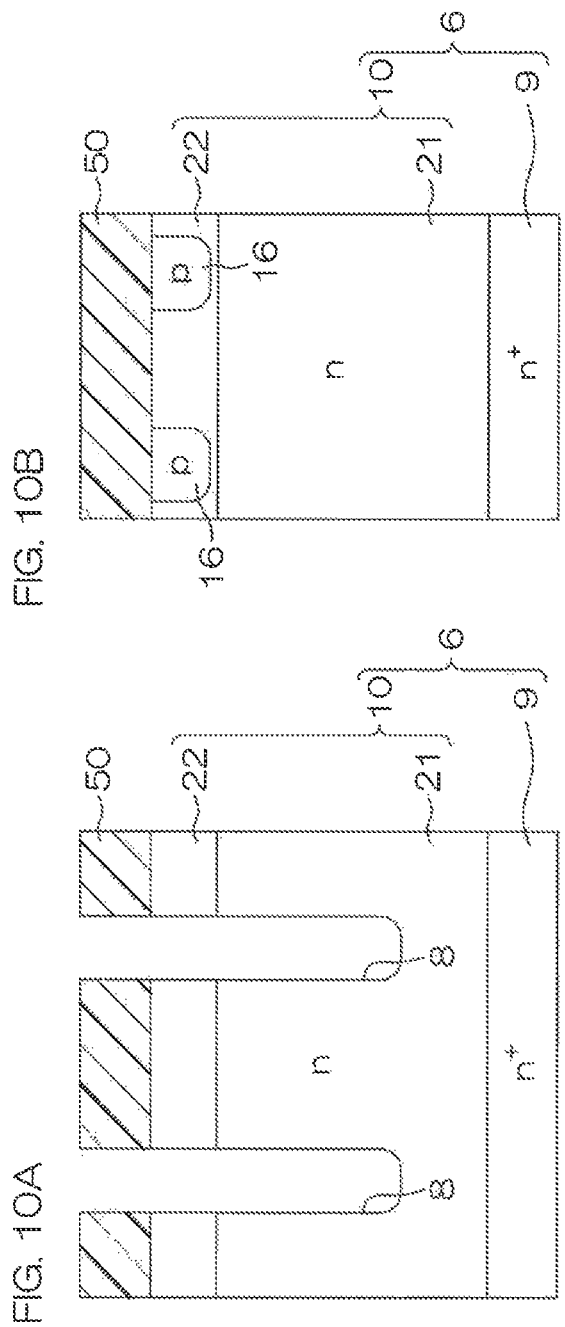

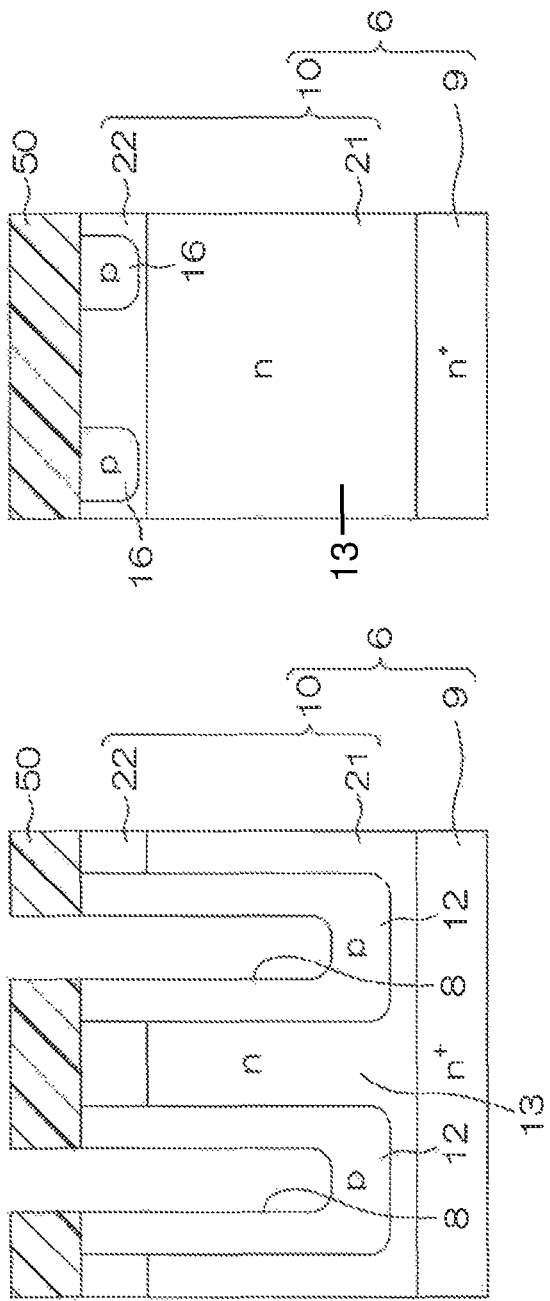

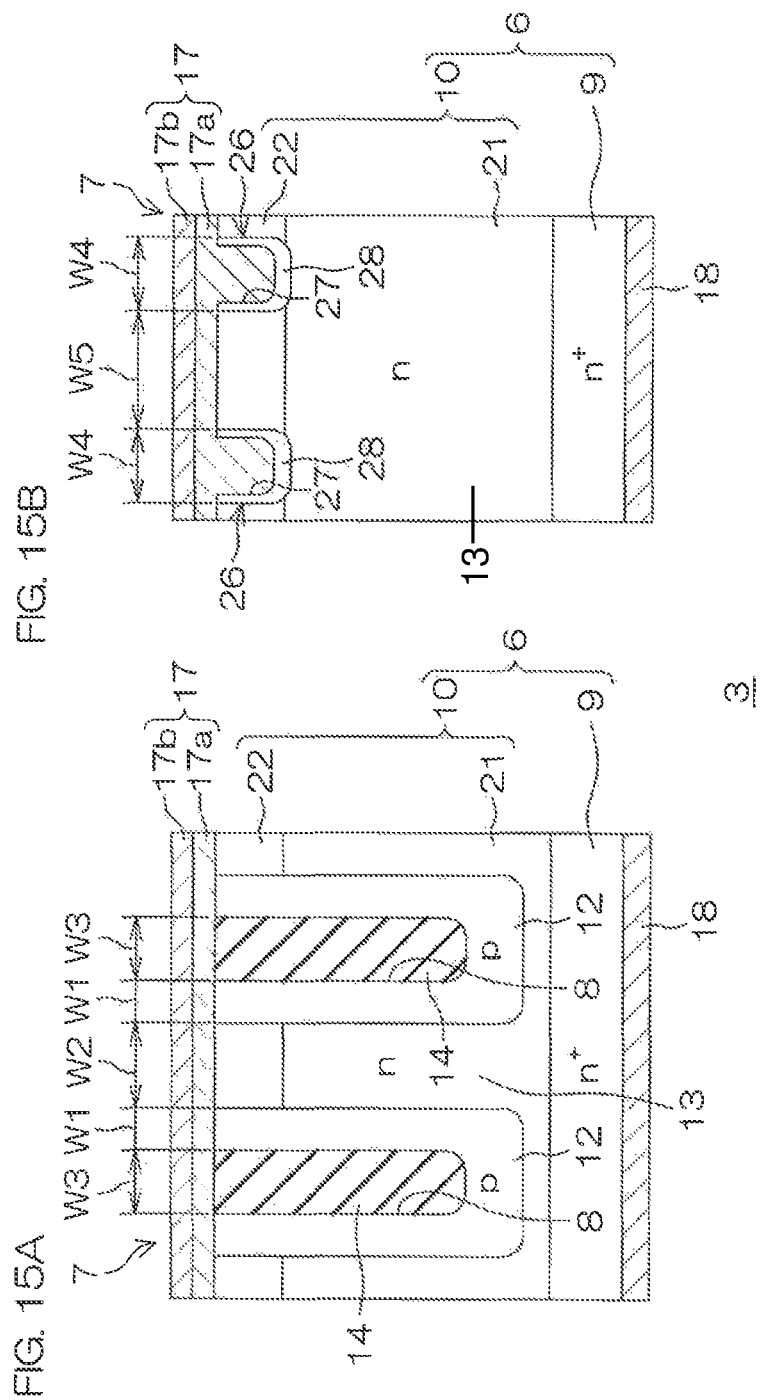

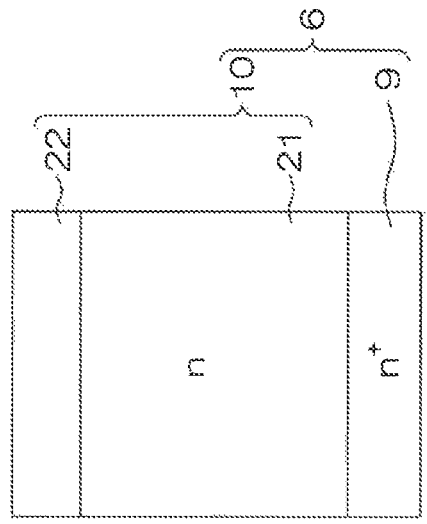
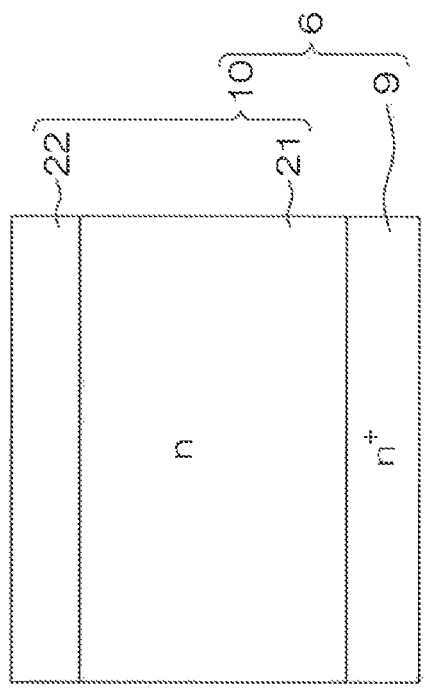

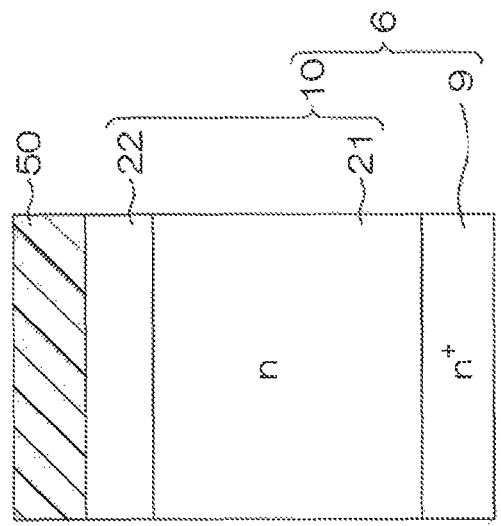
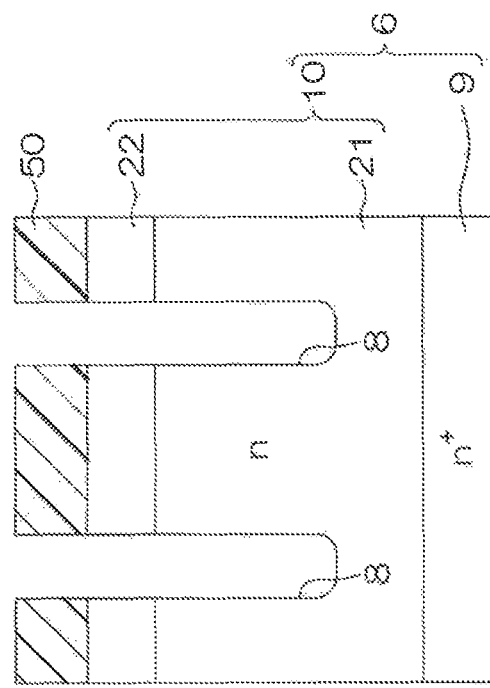

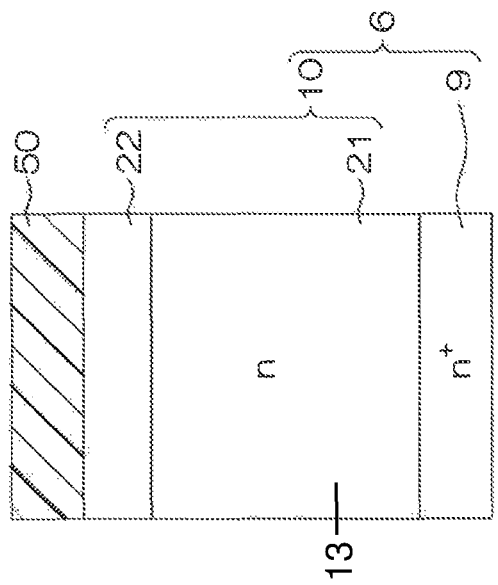
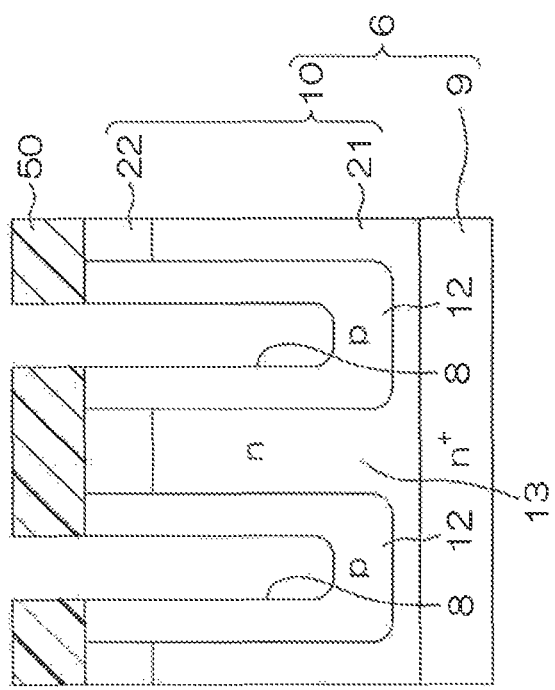

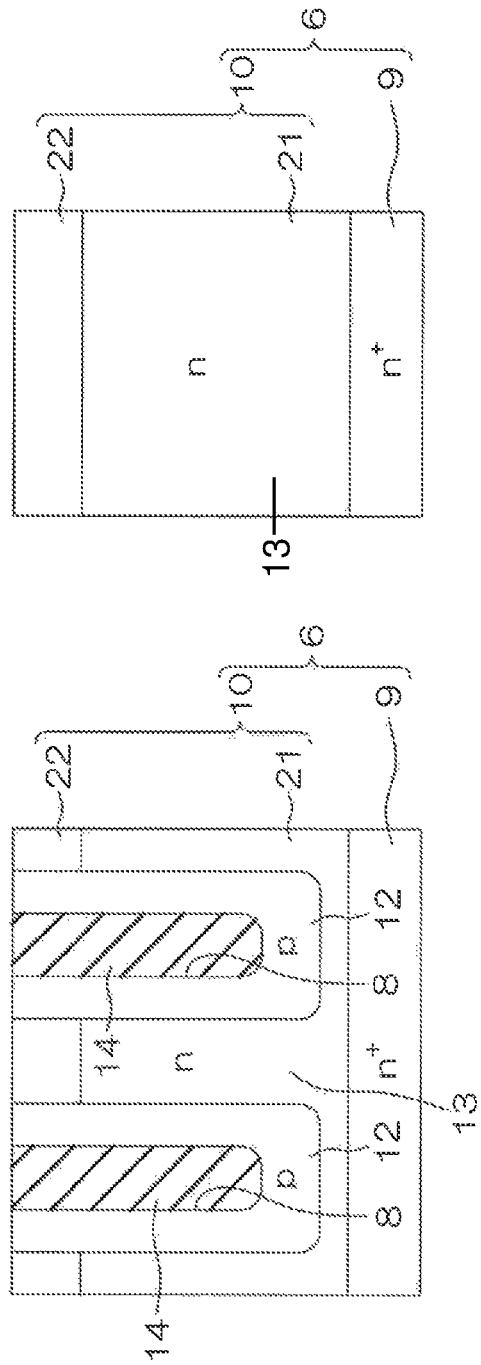

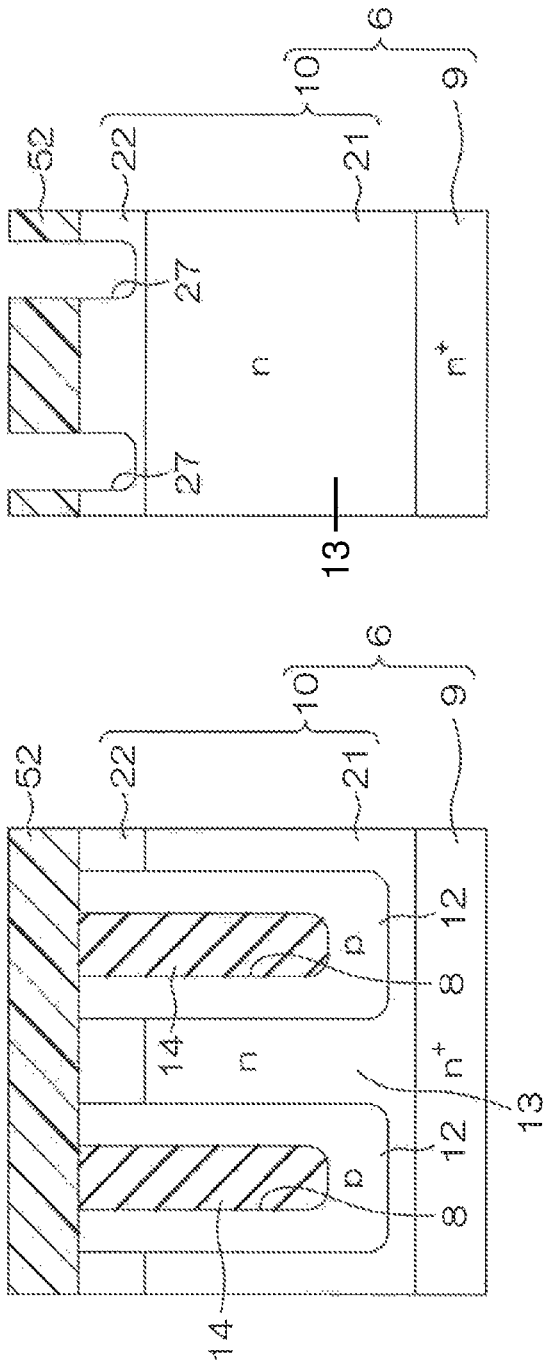

SEMICONDUCTOR DEVICE AND SEMICONDUCTOR DEVICE MANUFACTURING METHOD

TECHNICAL FIELD

The present invention relates to a SiC semiconductor device and a method for manufacturing the SiC semiconductor device.

BACKGROUND ART

A patent literature 1 includes an $n^+$ type silicon substrate, an n-type epitaxial layer formed on the silicon substrate, a plurality of trenches formed in the epitaxial layer, and a p-type column formed on the lateral surface of each trench. An n-type column is formed between the p-type columns adjacent to each other.

PRIOR ART DOCUMENT

Patent Literature

Patent literature 1: U.S. Unexamined Patent Application Publication No. 2009/0179298

SUMMARY OF THE INVENTION

Problems to be Solved by the Invention

An embodiment according to the present invention provides a semiconductor device including, a semiconductor layer composed of a first conductivity type SiC, a plurality of trenches formed in the semiconductor layer, a second conductivity type column region formed along the inner surface of each trench, a first conductivity type column region arranged between the second conductivity type column regions adjacent to each other, and an insulating film embedded in the trenches.

The semiconductor device can be manufactured, for example, by a method for manufacturing a semiconductor device according to an embodiment of the present invention. The method for manufacturing the semiconductor device includes a step of forming a plurality of trenches in a semiconductor layer composed of a first conductivity type SiC, a step of forming a second conductivity type column region along the inner surface of each trench by injecting second conductivity type impurities onto the inner surface of the trench while forming a first conductivity type column region between the second conductivity type column regions adjacent to each other, and a step of embedding an insulating film in the trench.

In the method according to an embodiment of the present invention, a super junction structure composed of the first conductivity type column region and the second conductivity type column region can be formed by injecting impurities onto the inner surface of the trench, and thus it is possible to provide a simple, low-cost semiconductor device.

More specifically, a method for embedding a second conductivity type SiC into a trench and a multi-epitaxial growth method have been considered as a method for forming a super junction structure in a semiconductor layer composed of SiC. The multi-epitaxial growth method is involved in the epitaxial growth of SiC while carrying out the injection (ion injection) of second conductivity type impurities over a plurality of time intervals. In this case, a second conductivity type impurity region can be formed without forming a trench in a semiconductor layer.

However, in the manufacturing method in which the second conductivity type SiC is embedded in a trench, in some cases it is difficult to achieve SiC regrowth in relation to the off angle of the semiconductor layer. Whereas, in the case of the multi-epitaxial growth method, since SiC has a higher density than Si (silicon), there is a problem that impurities are hardly diffused in SiC, and the second conductivity type impurity layer that can be formed by ion injection becomes thinner. For this reason, in the case of employing SiC, the number of layers in the epitaxial layer must be increased compared to a case where Si is employed, thereby increasing the time and the cost.

In contrast, according to the method of an embodiment according to the present invention, second conductivity type impurities are injected onto the inner surface of the trench. Further, the width of a column region from the inner surface of the trench can be easily controlled by adjusting the injection condition of the impurities, utilizing the fact that the impurities are hardly diffused in SiC. A pn junction is formed along the depth direction of the trench at the interface between the second conductivity type column region formed as described above and the first conductivity type column region.

Then, a depletion layer is formed in a direction orthogonal to the depth direction of the trench from the interface (pn junction). Thereby, a super junction structure can be formed.

As described above, since a super junction structure can be formed by the injection of impurities onto the inner surface of the trench, the semiconductor device can be simply provided at low cost. In addition, the semiconductor device provided makes it possible to improve a withstand voltage using a super junction structure.

The second conductivity type column region may be formed such that one surface and the other surface of the second conductivity type column region are formed along the inner surface of the trench.

According to an embodiment of the present invention, the following relational expression may be satisfied in relation to a direction along the surface of the semiconductor layer:

$$W2 \le W1 + W1 + W3$$

Where, W2 represents the width of the first conductivity type column region; W1 represents each width of the second conductivity type column region on both sides of the first conductivity type column region; and W3 represents the width of the trench.

Thereby, a depletion layer extending from one interface with the first conductivity type column region and another depletion layer extending from the other interface with the first conductivity type column region are integrated with each other so that the entire region of the first conductivity type column can be depleted. Consequently, a withstand voltage can be more effectively improved by the super junction structure.

The insulating film may be composed of a material having a relative permittivity lower than that of SiC. Specifically, the insulating film may be composed of $SiO_2$.

Thereby, the capacitance of a portion where the insulating film is embedded can be selectively reduced between the front and rear surfaces of the semiconductor layer. Accordingly, the capacitance between the front and rear surfaces of the semiconductor layer can be reduced as a whole.

An embodiment according to the present invention may include a surface electrode disposed on the semiconductor layer, which forms a Schottky junction with the first conductivity type column region. That is, according to this configuration, a semiconductor device including a Schottky-barrier diode can be provided.

In this case, the first conductivity type column region may include a low concentration region at the interface portion of the Schottky junction in which an impurity concentration is lower than a portion under the interface portion.

Thereby, an electric field intensity applied to the surface of the semiconductor layer during the application of a reverse voltage can be reduced. As a result, a leak current can be reduced during the application of the reverse voltage.

An embodiment according to the present invention may also include an electric field attenuation portion selectively formed in the surface part of the first conductivity type column region for attenuating the electric field intensity of the surface part.

Thereby, the electric field intensity in the first conductivity type column region can be attenuated, and thus an electric field is effectively prevented from concentrating in the first conductivity type column region.

The electric field attenuation portion may include a second conductivity type surface injection layer formed by impurity injection onto the surface of the first conductivity type column region.

The electric field attenuation portion may include a second trench selectively formed in the surface part of the first conductivity type column region, and a second conductivity type inner surface injection layer formed by impurity injection onto the inner surface of the second trench.

The semiconductor layer has a concentration profile in which an impurity concentration increases from the surface along the depth direction, and the second conductivity type column region along the bottom portion of the trench may be formed into a high concentration region in which the impurity concentration is higher than the surface part of the semiconductor layer.

The electric field formed by the second conductivity type column region along the inner surface of the trench is preferably uniformly formed along the depth direction of the trench. However, when the second conductivity type column region is formed by impurity injection onto the inner surface of the trench, the impurity concentration of the second conductivity type column region along the bottom portion of the trench might be relatively high.

Here, when a semiconductor layer is formed having a uniform impurity concentration, the electric field formed by the second conductivity type column region along the bottom portion of the trench is made higher than the electric field formed by the second conductivity type column region along the lateral portion of the trench. Accordingly, electric field might concentrate at the bottom portion and the edge portion of the trench.

Here, according to an embodiment of the present invention, the second conductivity type column region is formed having a high concentration region in which the impurity concentration is higher than the surface part of the semiconductor layer, and thus an increase in the electric field formed by the second conductivity type column region along the bottom portion of the trench is effectively suppressed. Thereby, even when the impurity concentration might be high in the second conductivity type column region at the bottom portion and the edge portion of the trench, electric field concentration can be effectively attenuated at the bottom portion and the edge portion of the trench.

Further, in the manufacturing process, the impurity concentration and the thickness of the high concentration region can be accurately controlled by utilizing the property of SiC that impurities are hardly diffused therein. Further, even when activation and so forth are carried out after ion injection, impurities are prevented from being widely diffused in the semiconductor layer. In this way, a semiconductor layer having a desired concentration profile can be formed.

In this case, the impurity concentration in the high concentration region is preferably higher than or equal to the impurity concentration in the second conductivity type column region.

According to this configuration, the second conductivity type column region within the high concentration region can be considered substantially as part of the high concentration region. Thereby, electric field concentration can be attenuated further effectively at the bottom portion and the edge portion of the trench.

BRIEF DESCRIPTION OF THE DRAWINGS

FIG. 2 is an enlarged view of a portion surrounded by a dash line II shown in FIG. 1.

FIGS. 5A and 5B are views illustrating the steps following the steps shown in FIGS. 4A and 4B.

FIGS. 6A and 6B are views illustrating the steps following the steps shown in FIGS. 5A and 5B.

FIGS. 9A and 9B are views illustrating part of manufacturing steps of the Schottky barrier diode shown in FIGS. 8A and 8B.

FIGS. 10A and 10B are views illustrating the steps following the steps shown in FIGS. 9A and 9B.

FIGS. 11A and 11B are views illustrating the steps following the steps shown in FIGS. 10A and 10B.

FIGS. 15A and 15B are schematic cross-sectional views of a Schottky barrier diode according to an embodiment of the present invention.

FIGS. 16A and 16B are views illustrating part of manufacturing steps of the Schottky barrier diode shown in FIGS. 15A and 15B.

FIGS. 17A and 17B are views illustrating the steps following the steps shown in FIGS. 16A and 16B.

FIGS. 18A and 18B are views illustrating the steps following the steps shown in FIGS. 17A and 17B.

FIGS. 19A and 19B are views illustrating the steps following the steps shown in FIGS. 18A and 18B.

FIGS. 20A and 20B are views illustrating the steps following the steps shown in FIGS. 19A and 19B.

EMBODIMENT FOR PRACTICING THE INVENTION

Hereinafter, an embodiment according to the present invention will be described in detail with reference to the attached drawings.

Figure 1:
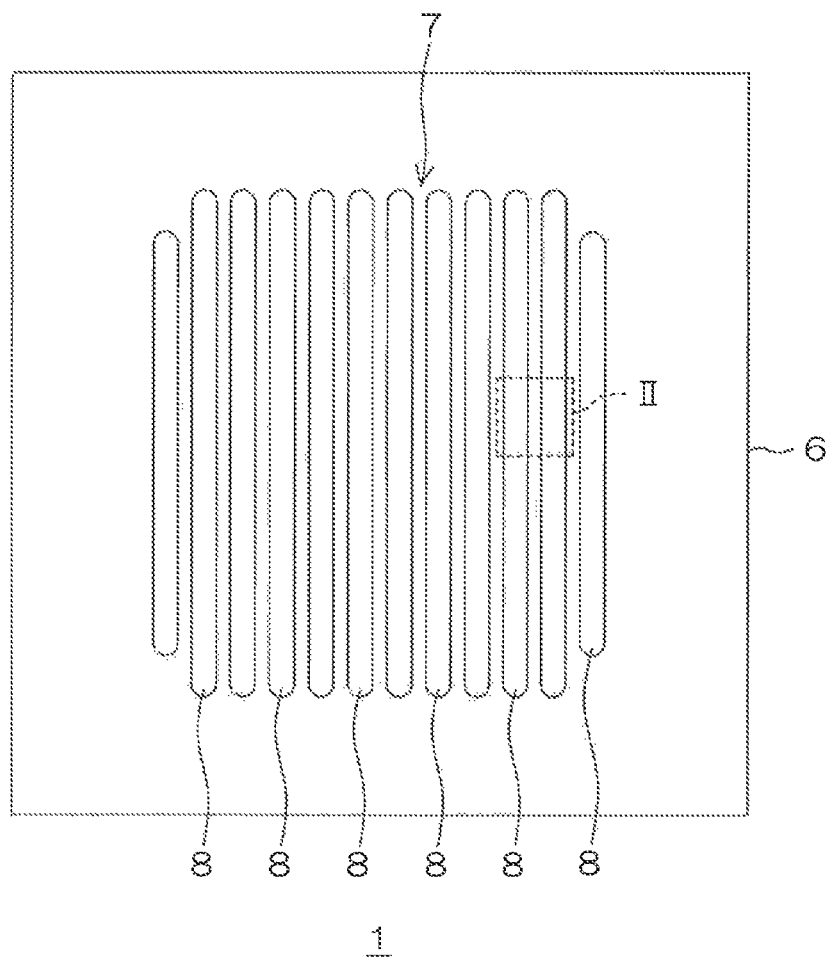
FIG. 1 is a schematic plan view of a Schottky barrier diode according to an embodiment of the present invention.

FIG. 1 is a schematic plan view of a Schottky barrier diode 1 according to an embodiment of the present invention.

The Schottky barrier diode 1 as an example of the semiconductor device according to the present invention includes a SiC semiconductor layer 6 formed into a rectangle in plan view when the surface is viewed along the line normal thereto (hereinafter, simply referred to as "in plan view"). The SiC semiconductor layer 6 shown in FIG. 1 has vertical and horizontal lengths of a few millimeters, respectively.

An active region 7 is provided at the inner region of the SiC semiconductor layer 6. A plurality of trenches 8 is formed in a stripe shape spaced apart from each other in the active region 7 in plan view. Hereinafter, description will be made with the formation direction of the trench 8 defined as a "stripe direction." Both ends of each trench 8 in the stripe direction are formed in a curved shape with rounded-off corners. Hereinafter, the structure of the active region 7 is specifically described with reference to FIGS. 2 and 3.

Figure 3B:
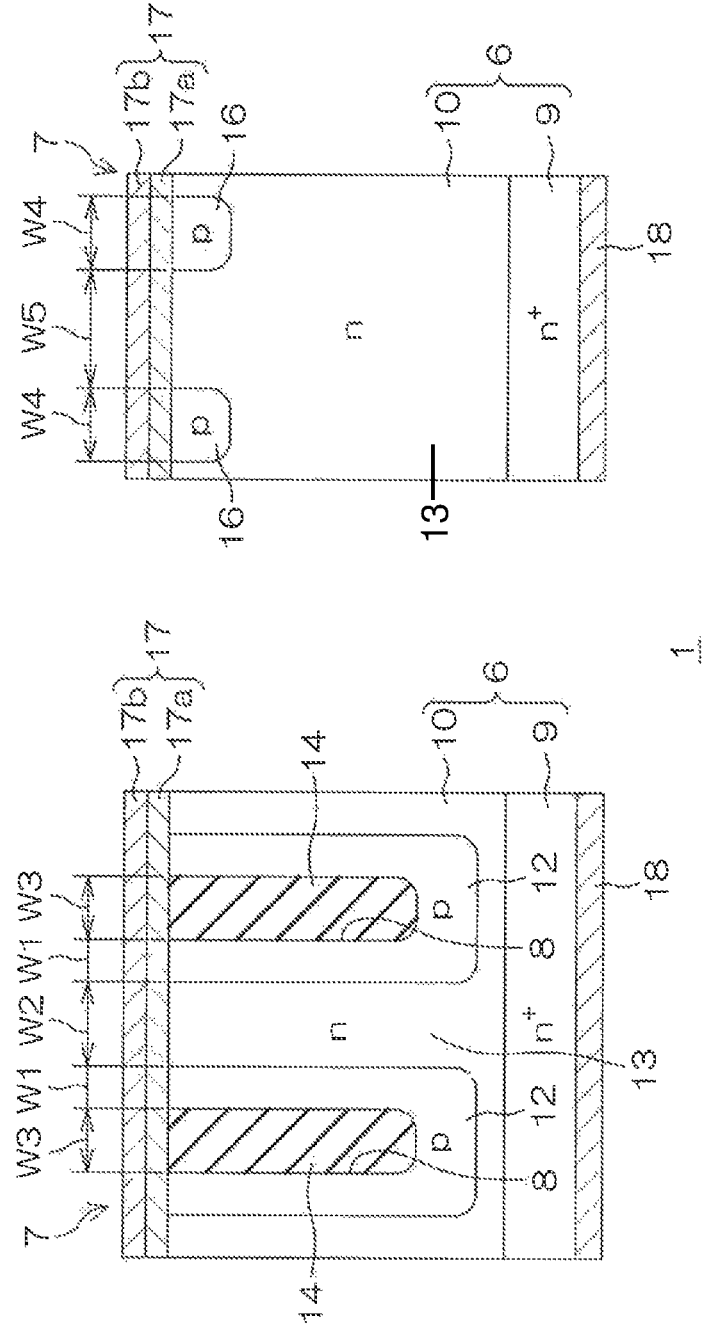
FIGS. 3A and 3B are cross-sectional views appearing when the Schottky barrier diode is taken along lines IIIa-IIIa and IIIb-IIIb shown in FIG. 2.
Figure 3A:
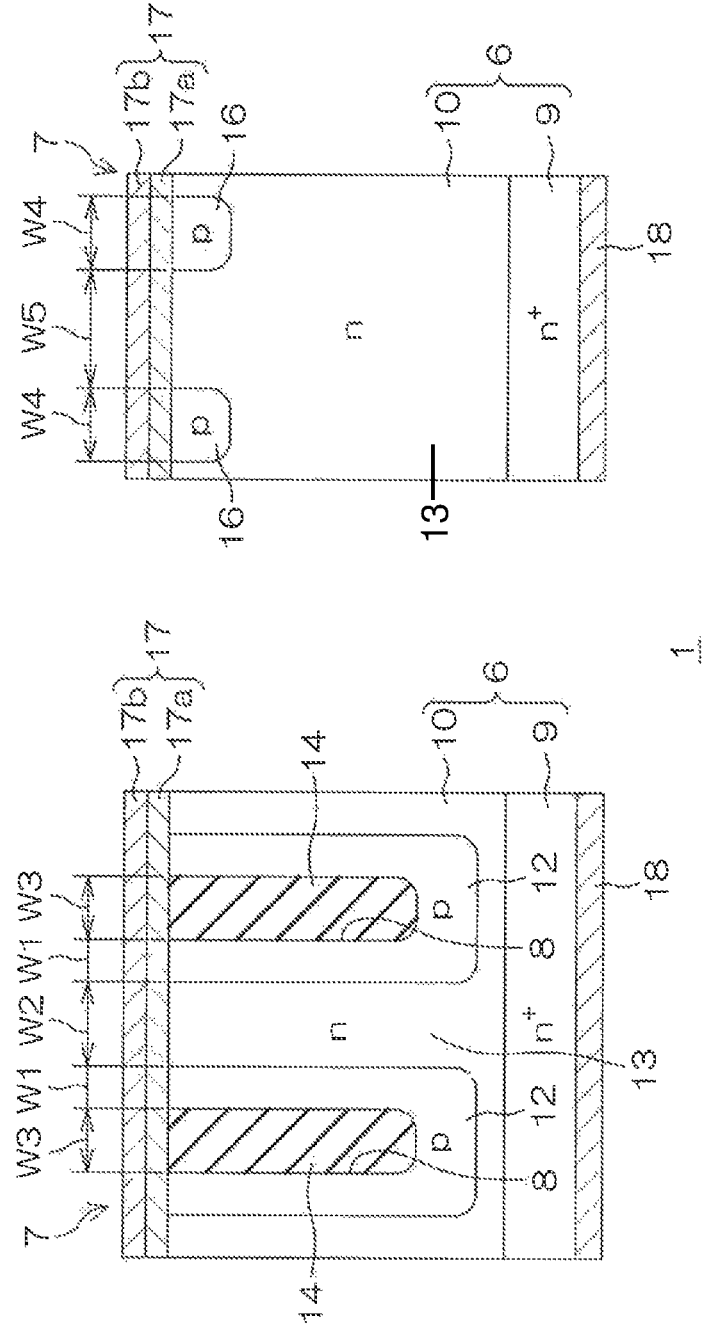

FIG. 2 is an enlarged view of a portion surrounded by a dash line II shown in FIG. 1. FIGS. 3A and 3B are cross-sectional views appearing when the Schottky barrier diode 1 is taken along lines IIIa-IIIa and IIIb-IIIb shown in FIG. 2.

As shown in FIGS. 3A and 3B, a SiC semiconductor layer 6 includes an n$^+$ type SiC substrate 9 and an n-type SiC epitaxial layer 10. The n-type SiC epitaxial layer 10 according to this embodiment is formed as a drift layer. The thickness of the SiC substrate 9 is, for example, 50 μm to 600 μm, and the thickness of the SiC epitaxial layer 10 is, for example, 3 μm to 100 μm. Further, the impurity concentration of the SiC substrate 9 is, for example, $1\times10^{18}$ cm$^{-3}$ to $1\times10^{20}$ cm$^{-3}$, and the impurity concentration of the SiC epitaxial layer 10 is, for example, $5\times10^{14}$ cm$^{-3}$ to $5\times10^{17}$ cm$^{-3}$. For example, nitrogen (N), phosphorus (P), arsenic (As) and so forth can be used as an n-type impurity.

Each trench 8 is formed from the surface of the SiC epitaxial layer 10 along the thickness direction. The bottom portion of each trench 8 is positioned between the surface of the SiC epitaxial layer 10 and the surface of the SiC substrate 9. The edge portion between the lateral surface and the bottom portion of each trench 8 is formed in a shape curved outward from each trench, and each trench 8 is formed in a U-shape in cross-sectional view. If the edge portion of each trench 8 is formed in a curved shape, the electric field concentrated at the edge portion can be attenuated. A p-type column region 12 formed in an annular shape in plan view is formed so as to surround each trench 8.

The p-type column region 12 is formed along the inner surface of each trench 8. More specifically, the p-type column region 12 has one surface and the other surface formed along the lateral surface and the bottom portion of each trench 8, and is exposed from the inner surface of the trench 8. Further, according to this embodiment, the portion formed along the bottom portion of each trench 8 is formed thicker than the portion formed along the lateral surface of each trench 8 in the p-type column region 12. The bottom portion of the p-type column region 12 formed along the bottom portion of each trench 8 is positioned between the bottom portion of each trench 8 and the interface between the SiC substrate 9 and the SiC epitaxial layer 10. The impurity concentration of the p-type column region 12 is, for example, $5\times10^{14}$ cm$^{-3}$ to $5\times10^{17}$ cm$^{-3}$. For example, boron (B), aluminum (Al) and so forth can be used as a p-type impurity.

Additionally, although this embodiment describes an example in which the p-type column region 12 is formed along the entire lateral surface and bottom portion of the trench 8, it is enough if the p-type column region 12 is formed along at least the lateral surface of the trench 8. The bottom portion of the p-type column region 12 may be formed separated from the lateral portion or it could be that the p-type column region 12 is not formed at the bottom portion. Further, although an example in which the p-type column region 12 is exposed from the inner surface of the trench 8 is described, part of the SiC epitaxial layer 10 may be included in the p-type column region 12 so that the part of the SiC epitaxial layer 10 is exposed from the inner surface of the trench 8. An n-type column region 13 composed of part of the SiC epitaxial layer 10 is formed between the p-type column regions 12 adjacent to each other.

The n-type column region 13 is formed along the stripe direction of the trench 8. The n-type column region 13 is formed to have a width wider than the width of the p-type column region 12 in a direction orthogonal to the stripe direction. More specifically, the width W2 of the n-type column region 13 is defined to satisfy the following relational expression along the direction orthogonal to the stripe direction: W2≤W1+W1+W3, where W1 represents each width of the p-type column regions 12 on both sides of the n-type column region 13; and W3 represents the width of the trench 8. The width W1 of the p-type column regions 12 is, for example, 0.2 μm to 2 μm. The width W2 of the n-type column regions 13 is, for example, 0.4 μm to 4 μm. The width W3 of the trench 8 is, for example, 1 μm to 20 μm A pn junction portion is formed at the interface between the p-type column regions 12 and the SiC epitaxial layer 10. Accordingly, a depletion layer is formed along the direction orthogonal to the depth direction of the trench 8 at the interface (pn junction portion) between the p-type column regions 12 and the n-type column region 13. If the width W2 of the n-type column region 13 satisfies the conditional expression: W2≤W1+W1+W3, a depletion layer extending from one interface with the n-type column region 13 and another depletion layer extending from the other interface with the n-type column region 13 can be formed to overlap each other in the n-type column region 13. That is, the depletion layer extending from each interface with the n-type column region 13 is integrated with each other in the n-type column region 13 so that the entire region of the n-type column 13 is depleted. In this way, according to this embodiment, a plurality of super junction structures is formed along the direction orthogonal to the stripe direction of the trench 8.

As shown in FIG. 3A, an insulating film 14 is embedded in each trench 8. The insulating film 14 may be embedded in part of the trench 8, or may be embedded in the whole of the trench 8. The insulating film 14 is preferably made of a material having a relative permittivity lower than SiC. For example, $SiO_2$ may be used as the material of the insulating film 14. According to $SiO_2$, the capacitance between an anode electrode 17 and a cathode electrode 18 in the trench 8 can be reduced, and thus the capacitance between the anode electrode 17 and the cathode electrode 18 in the SiC semiconductor layer 6 can be reduced as a whole.

As shown in FIGS. 2 and 3B, a plurality of surface injection layers 16 is formed along the stripe direction as an example of an electric field attenuation region in the surface part of each n-type column region 13. The surface injection layer 16 is a region for attenuating the electric field intensity in the surface part of the n-type column region 13.

Each surface injection layer 16 is formed in the surface part of the n-type column region 13. Each surface injection layer 16 is formed spaced apart from each other along the stripe direction of the trench 8. The width 4 of each surface injection layer 16 in the stripe direction is, for example, 0.5 µm to 5 µm, and the width 5 between each surface injection layer 16 is, for example, 1 µm to 10 µm. The width of each surface injection layer 16 orthogonal to the stripe direction is the same as the width W2 of the n-type column region 13.

A pn junction portion is formed at the interface between the surface injection layer 16 and the n-type column region 13. A depletion layer is formed along the pn junction portion to contribute to the attenuation of electric field intensity.

The anode electrode 17 is formed as an example of the surface electrode on the surface of the SiC epitaxial layer 10. The anode electrode 17 is formed so as to cover the active region 7, and is electrically connected to the p-type column region 12, the n-type column region 13 and the surface injection layer 16. The anode electrode 17 has a laminate structure in which different conductive materials are laminated.

More specifically, the anode electrode 17 includes a lower layer electrode 17a and an upper layer electrode 17b as shown in FIGS. 3A and 3B. The lower layer electrode 17a forms a Schottky junction with the surface of the SiC epitaxial layer 10, more specifically, with the n-type column region 13. The upper layer electrode 17b is formed on the lower layer electrode 17a, and an external connection wire such as a bonding wire is connected to the upper layer electrode 17b. For example, (Ti), nickel (Ni) and so forth may be used as the conductive material of the lower layer electrode 17a. Further, aluminum and so forth may be used as the conductive material of the upper layer electrode 17b.

Meanwhile, the cathode electrode 18 as a rear surface electrode is formed on the rear surface of the SiC substrate 9. The cathode electrode 18 forms an ohmic contact with the SiC substrate 9. As such, according to this embodiment, the Schottky barrier diode 1 having a super junction structure is formed.

The operation of the Schottky barrier diode 1 will be described as follows. When a voltage is not applied to the anode electrode 17 (applied voltage=0 V), the movement of electrons as majority carriers is obstructed by a Schottky barrier, and thus the currents do not flow. At this time, the n-type column region 13 does not need to be entirely depleted. According to the super junction structure, the impurity concentration in the n-type column region 13 can be made relatively high. In this case, although the depletion layer at the interface between the p-type column region 12 and the n-type column region 13 is hardly extended, the movement of electrons is restricted by the Schottky barrier. Therefore, even if the n-type column region 13 is not entirely depleted, the currents do not flow.

When a forward voltage higher than the Schottky barrier is applied to the anode electrode 17, electrons as majority carriers move from the cathode electrode 18 toward the anode electrode 17, and thus the currents flow.

Whereas, when a reverse voltage is applied to the anode electrode 17, depletion layers extend from each of the interfaces (each of the pn junction portions) between the p-type column regions 12 and the n-type column regions 13, and thus the n-type column region 13 is entirely depleted. Thereby, the current path from the anode electrode 17 to the cathode electrode 18 is closed. Consequently, electrons as the majority carriers cannot move between the anode electrode 17 and the cathode electrode 18, and thus the currents do not flow.

Next, a method for manufacturing the Schottky barrier diode 1 will be described.

FIGS. 4A, 4B-7A, and 7B are views illustrating part of steps of manufacturing the Schottky barrier diode 1 shown in FIGS. 3A and 3B.

Figure 4A:
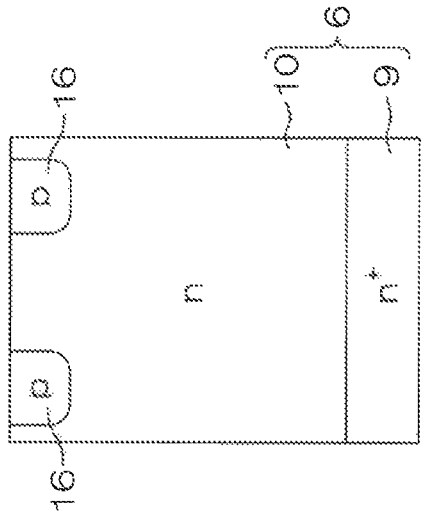
FIGS. 4A and 4B are views illustrating part of manufacturing steps of the Schottky barrier diode shown in FIGS. 3A and 3B.
Figure 4B:
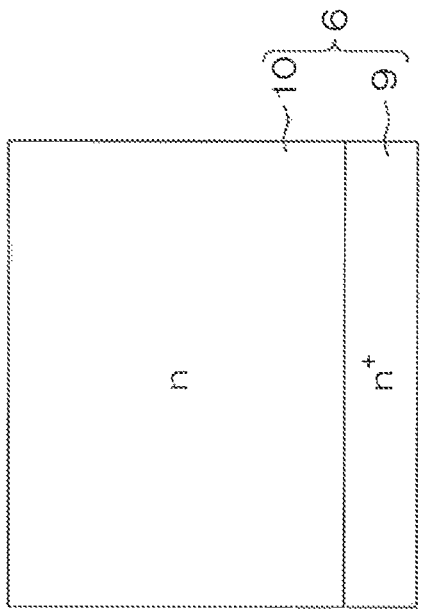

First, the n+ type SiC substrate 9 is prepared as shown in FIGS. 4A and 4B. Next, SiC grows epitaxially while n-type impurities are injected so that the n-type SiC epitaxial layer 10 is formed on the SiC substrate 9. Thereby, the SiC semiconductor layer 6 including the SiC substrate 9 and the SiC epitaxial layer 10 is formed.

Next, an ion injection mask (not shown) is formed on the SiC epitaxial layer 10, the iron injection mask having an opening selectively formed in a region in which the surface injection layer 16 is to be formed. Then, p-type impurities are injected into the surface part of the SiC epitaxial layer 10 through the ion injection mask. Thereby, the surface injection layer 16 is formed. At this time, a plurality of the surface injection layers 16 is formed in a stripe shape along a direction orthogonal to the formation direction of the trenches 8 (that is, the stripe direction of the trenches 8) to be formed in the following step (also, see FIG. 2). After the surface injection layers 16 are formed, the ion injection mask is removed.

Next, as shown in FIGS. 5A and 5B, a hard mask 50 is formed on the SiC epitaxial layer 10, the hard mask having an opening selectively formed in a region in which the trenches 8 are to be formed. Then, a plurality of the stripe shaped trenches 8 is formed along a direction orthogonal to the plurality of the surface injection layers 16 by etching through the hard mask 50.

Next, as shown in FIGS. 6A and 6B, p-type impurities (for example, aluminum) are injected onto the inner surface (the lateral surface and the bottom portion of each trench 8) by utilizing the hard mask 50 used when forming the trenches 8. The p-type impurities are injected onto the inner surface of each trench 8 with a predetermined inclination angle with respect to the surface of the SiC epitaxial layer 10. The p-type impurities are injected under the injection conditions that, for example, a doping energy is 30 keV to 1200 keV, and a dose amount is $1 \times 10^{10}$ $cm^{-2}$ to $1 \times 10^{13}$ $cm^{-2}$. The injection of the p-type impurities onto the inner surface of the trench 8 may be a single-stage injection in which the injection of the p-type impurities is performed only one time, or a multi-stage injection in which the injection is performed a plurality of times. After the p-type impurities are injected onto the inner surface of each trench 8, the hard mask 50 is removed.

Next, annealing is carried out in the range of temperatures between 1500° C. and 2000° C. Thereby, the p-type impurities are activated, and thus the p-type column region 12 and the n-type column region 13 are formed.

Figure 7B:
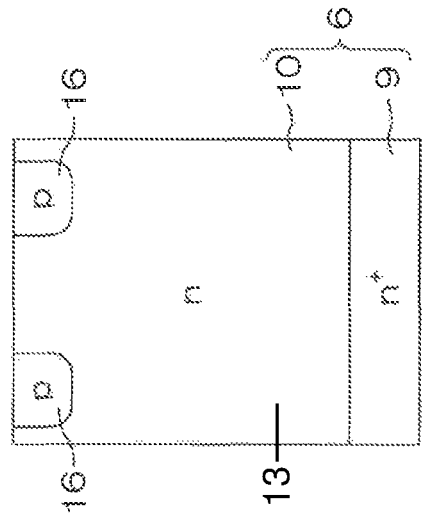
FIGS. 7A and 7B are views illustrating the steps following the steps shown in FIGS. 6A and 6B.
Figure 7A:
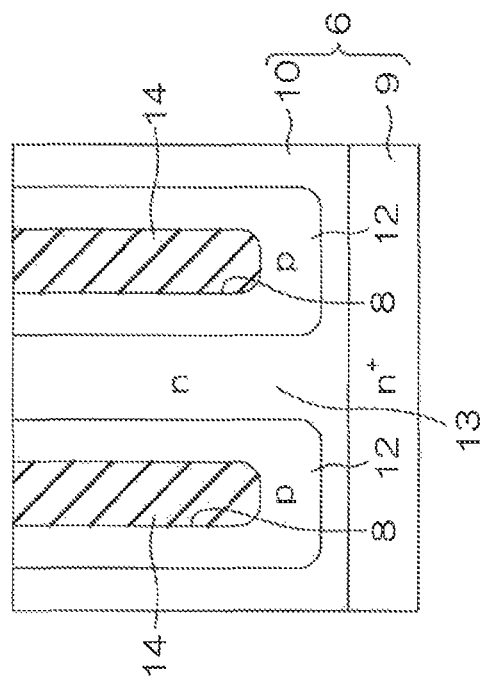

Next, as shown in FIGS. 7A and 7B, each trench 8 is filled using, for example, CVD method so that the insulating film 14 ($SiO_2$ film in this embodiment) is formed to cover the surface of the SiC epitaxial layer 10. Then, the undesired portions of the insulating film 14 are removed by etch back. Thereby, the insulating film 14 is embedded in each trench 8.

Thereafter, as shown in FIGS. 3A and 3B, the anode electrode 17 (lower layer electrode 17a and upper layer electrode 17b) is formed on the surface of the SiC epitaxial layer 10 and the cathode electrode 18 is formed on the rear surface of the SiC substrate 9. The Schottky barrier diode 1 is formed after the steps described above are carried out.

According to the method described above, a super junction structure constituted by the p-type column region 12 and n-type column region 13 can be formed by injecting impurities onto the inner surface of the trench 8, and thus the Schottky barrier diode 1 can be simply provided at a low cost.

More specifically, for example, a method for embedding a p-type SiC into a trench 8 and a multi-epitaxial growth method are known as a method for forming a super junction structure in the SiC semiconductor layer 6. The multi-epitaxial growth method is involved in the epitaxial growth of SiC while carrying out the injection of p-type impurities over a plurality of time intervals. In this case, a p-type impurity region can be formed without forming a trench 8 in the SiC semiconductor layer 6 (SiC epitaxial layer 10).

However, in the manufacturing method in which the p-type SiC is embedded in a trench 8, in some cases it is difficult to achieve SiC regrowth in relation to the off angle of the SiC semiconductor layer 6 (SiC epitaxial layer 10). Whereas, in the case of the multi-epitaxial growth method, since SiC has a higher density than Si (silicon), there is a problem that impurities are hardly diffused in SiC, and the second conductivity type impurity layer that can be formed by ion injection becomes thinner. For this reason, in the case of employing the SiC substrate 9, the number of layers in the epitaxial layer must be increased compared to a case where a Si substrate is employed, thereby increasing the time and the cost.

In contrast, according to this embodiment, the p-type impurities are injected onto the inner surface of the trench 8. Further, the width W1 of the p-type column region 12 from the inner surface of the trench 8 can be easily controlled by adjusting the injection condition of the p-type impurities, utilizing the fact that the impurities are hardly diffused in SiC. A pn junction is formed along the depth direction of the trench 8 at the interface between the p-type type column region 12 formed as described above and the n-type type column region 13. A depletion layer is formed in a direction orthogonal to the depth direction of the trench 8 from the interface (pn junction). In this way, a super junction structure consisting of the p-type column region 12 and the n-type column region 13 can be formed, and thus a withstand voltage can be improved.

Further, in the Schottky barrier diode 1, the width W2 of the n-type column region 13 is defined to satisfy the following relational expression along the direction orthogonal to the stripe direction of the trench 8: W2≤W1+W1+W3, where W1 represents each width of the p-type column regions 12 on both sides of the n-type column region 13; and W3 represents the width of the trench 8. Thereby, a depletion layer extending from one interface with the n-type column region 13 and another depletion layer extending from the other interface with the n-type column region 13 are integrated with each other so that the n-type column region 13 can be entirely depleted. As such, it is possible to uniform the electric field intensity in the n-type column region 13 (SiC epitaxial layer 10). As a result, it is possible to achieve more favorably the improvement of a withstand voltage due to a super junction structure.

Figure 8B:
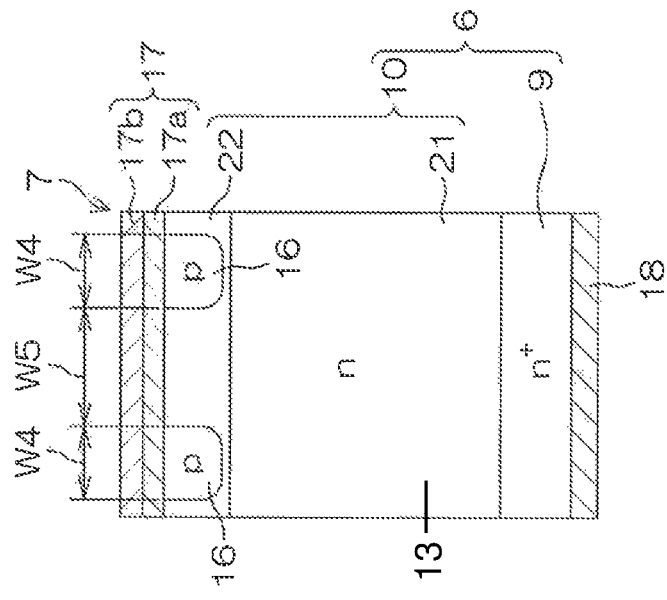
FIGS. 8A and 8B are schematic cross-sectional views of a Schottky barrier diode according to an embodiment of the present invention.
Figure 8A:
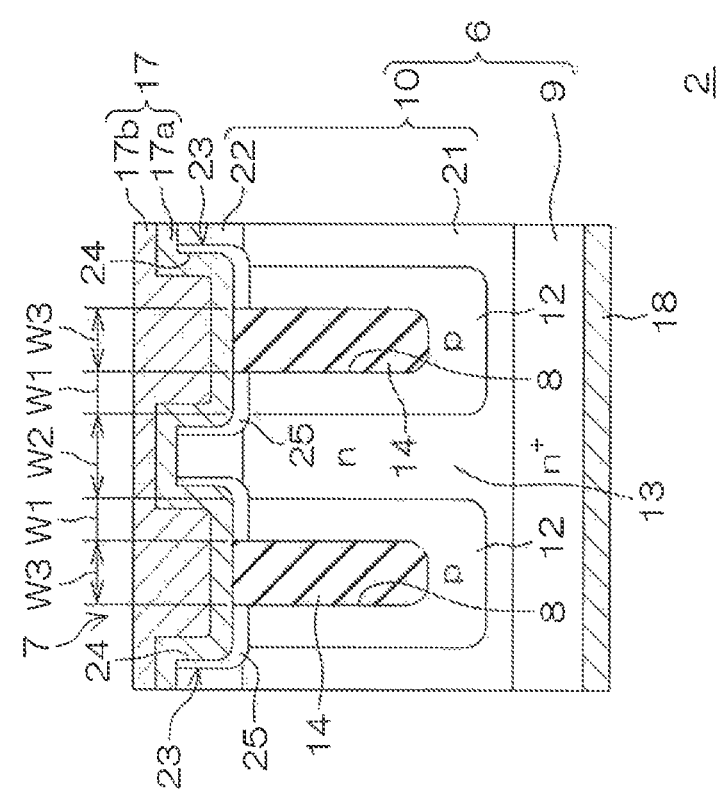

FIGS. 8A and 8B are schematic cross-sectional views of a Schottky barrier diode 2 according to an embodiment of the present invention. The same reference numerals are applied to each part of FIGS. 8A and 8B corresponding to those of FIGS. 3A and 3B and the description will be omitted.

As shown in FIGS. 8A and 8B, the SiC epitaxial layer 10 in the Schottky barrier diode 2 according to this embodiment includes an n-type first drift layer 21 and n⁻ type second drift layer 22 formed on the first drift layer 21, having a concentration lower than the first drift layer 21 as an example of a low concentration region according to the present invention. The impurity concentration of the first drift layer 21 is, for example, $5 \times 10^{14}$ cm$^{-3}$ to $5 \times 10^{17}$ cm$^{-3}$, and the impurity concentration of the second drift layer 22 is, for example, $1 \times 10^{14}$ cm$^{-3}$ to $1 \times 10^{17}$ cm$^{-3}$. That is, the n-type column region 13 according to this embodiment is configured to include the first drift layer 21 and the second drift layer 22.

A plurality of first electric field attenuation regions 23 is formed in the SiC epitaxial layer 10. The first electric field attenuation region 23 includes a first surface trench 24 and a p-type first inner surface injection layer 25 formed in an annular shape in plan view so as to surround each first surface trench 24. Additionally, the above described trench 8 and p-type column region 12 are formed under the first surface trench 24 in this embodiment.

Each first surface trench 24 is formed along the thickness direction from the surface of the SiC epitaxial layer 10 with the bottom portion positioned midway in the second drift layer 22. Each first surface trench 24 may be formed so that the bottom portion crosses the boundary between the first drift layer 21 and the second drift layer 22, and is positioned midway in the first drift layer 21. The edge portion between the lateral surface and the bottom portion is formed in a shape curved outward from each first surface trench 24. If the edge portion of each first surface trench 24 is formed in a curved shape, it is possible to attenuate the electric field concentrated at the edge portion.

The first surface trench 24 is formed to have a width wider than that of the trench 8 along a direction orthogonal to the stripe direction of the trench 8. More specifically, the first surface trench 24 is formed to cover the entire region of the trench 8 and the p-type column region 12 and has an overlap portion that crosses the boundary (pn junction portion) between the p-type column region 12 and the n-type column region 13.

The first inner surface injection layer 25 is formed along the inner surface (lateral surface and bottom portion) of the first surface trench 24. More specifically, one surface and the other surface of the first inner surface injection layer 25 are formed along the lateral surface and the bottom surface of the first surface trench 24. More specifically, according to this embodiment, the portion of the first inner surface injection layer 25 formed along the bottom portion of the first surface trench 24 is formed thicker than the portion formed along the lateral surface of the first surface trench 24. The first inner surface injection layer 25 is formed so as to cross the boundary (pn junction portion) between the p-type column region 12 and the n-type column region 13 along a direction orthogonal to the stripe direction and cross the boundary between the first drift layer 21 and the second drift layer 22 along the depth direction. In this way, a first electric field attenuation region 23 is formed.

According to this embodiment, a pn junction portion is formed at the interface between the first inner surface injection layer 25 and the second drift layer 22 that has a lower impurity concentration. Therefore, a depletion layer is formed in the direction orthogonal to the depth direction of the first surface trench 24 at the interface (pn junction portion) between the first inner surface injection layer 25 and the second drift layer 22. The second drift layer 22 that has a lower impurity concentration and the depletion layer in the second drift layer 22 contribute to the attenuation of the electric field intensity at the interface portion of the Schottky junction.

The trench 8 is formed to pass through the first inner surface injection layer 25 along the thickness direction from the bottom portion of the first surface trench 24. Further, the p-type column region 12 is formed so that the upper portion thereof comes in contact with the first inner surface injection layer 25.

According to this embodiment, the bottom portion of the surface injection layer 16 is positioned midway in the second drift layer 22. The bottom portion of the surface injection layer 16 may cross the boundary between the first drift layer 21 and the second drift layer 22 to be positioned in the first drift layer 21.

The anode electrode 17 is formed to get into the first surface trench 24 from the surface of the SiC epitaxial layer 10. The anode electrode 17 getting into the first surface trench 24 is electrically connected to the second drift layer 22, the p-type column region 12, and the n-type column region 13 through the first inner surface injection layer 25. The anode electrode 17 (lower layer electrode 17a) forms a Schottky junction with the n-type column region 13.

Next, a method for manufacturing the Schottky barrier diode 2 will be described.

FIGS. 9A and 9B to 14A and 14B are views illustrating part of manufacturing steps of the Schottky barrier diode 2 shown in FIGS. 8A and 8B, respectively.

First, the n⁺ type SiC substrate 9 is prepared as shown in FIGS. 9A and 9B. Next, SiC grows epitaxially while n-type impurities are selectively injected so that the n-type SiC epitaxial layer 10 including the first drift layer 21 and the second drift layer 22 in this order is formed on the SiC substrate 9. Then, the surface injection layer 16 is formed after the same steps as those shown in FIGS. 4A and 4B are carried out.

Next, as shown in FIGS. 10A and 10B, the trench 8 is formed after the same steps as those shown in FIGS. 5A and 5B are carried out. At this time, the bottom portion of each trench 8 is formed in the first drift layer 21 at a midway position along the depth direction.

Next, as shown in FIGS. 11A and 11B, the p-type column region 12 and the n-type column region 13 are formed after the same steps as those shown in FIGS. 6A and 6B are carried out.

Figure 12B:
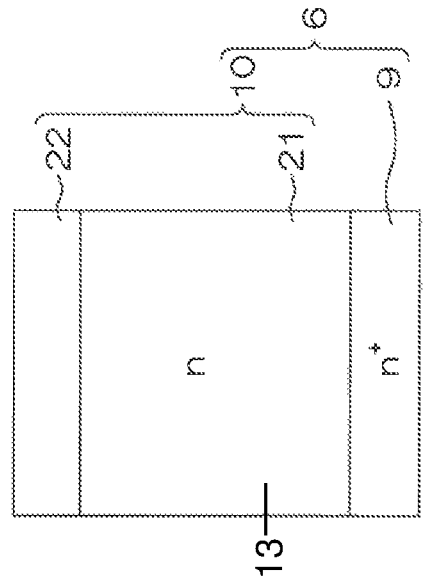
FIGS. 12A and 12B are views illustrating the steps following the steps shown in FIGS. 11A and 11B.
Figure 12A:
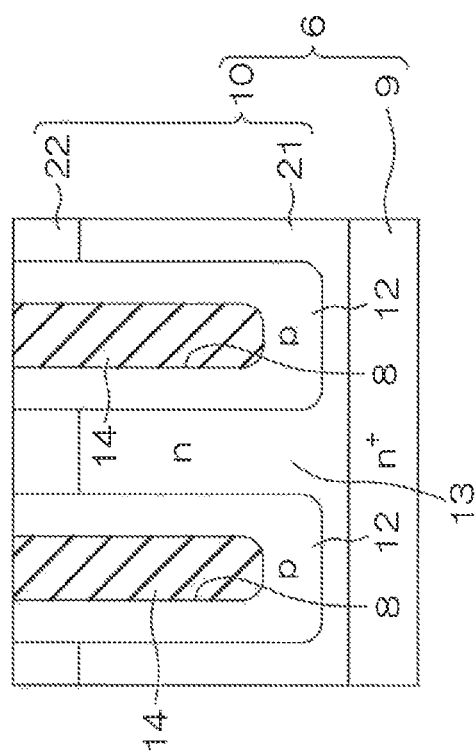

Next, as shown in FIGS. 12A and 12B, the insulating film 14 is embedded in each trench 8 after the same steps as those shown in FIGS. 7A and 7B are carried out.

Figure 13B:
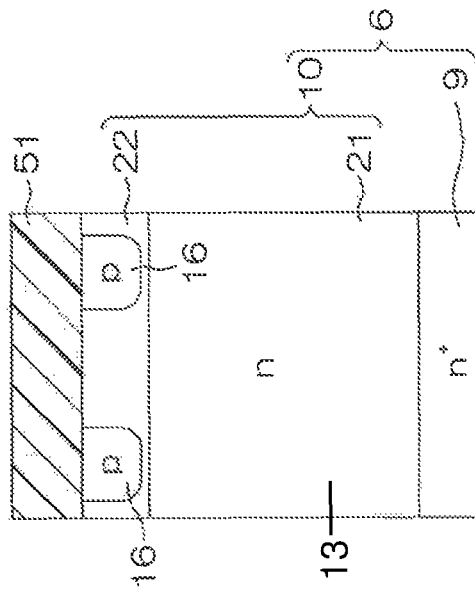
FIGS. 13A and 13B are views illustrating the steps following the steps shown in FIGS. 12A and 12B.
Figure 13A:
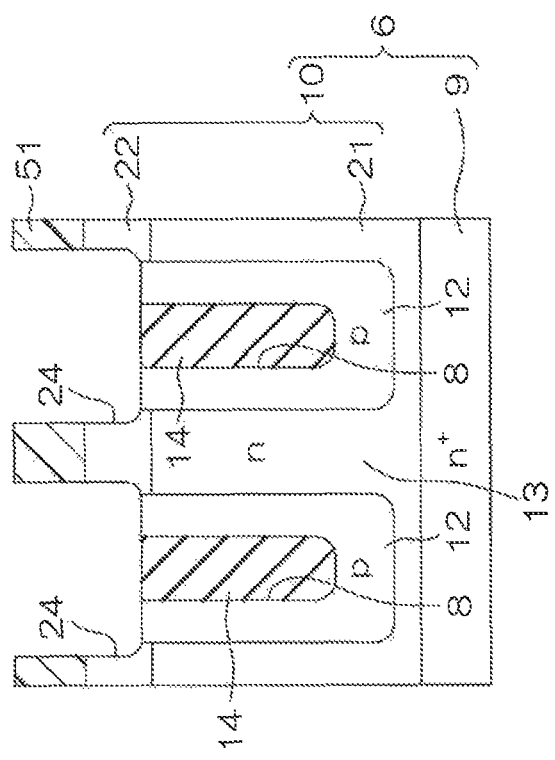

Next, as shown in FIGS. 13A and 13B, a hard mask 51 is formed on the SiC epitaxial layer 10, which has an opening selectively formed in a region where the first surface trench 24 is to be formed. Then, the first surface trench 24 is formed by etching through the hard mask 51. At this time, the bottom portion of the first surface trench 24 may be formed in the second drift layer 22 at a midway position along the depth direction or may be formed in the first drift layer 21 at a midway position along the depth direction after passing through the second drift layer 22.

Figure 14B:
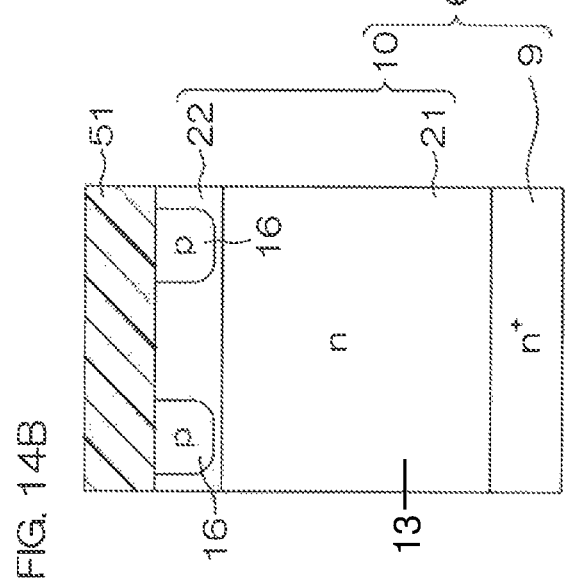
FIGS. 14A and 14B are views illustrating the steps following the steps shown in FIGS. 13A and 13B.
Figure 14A:
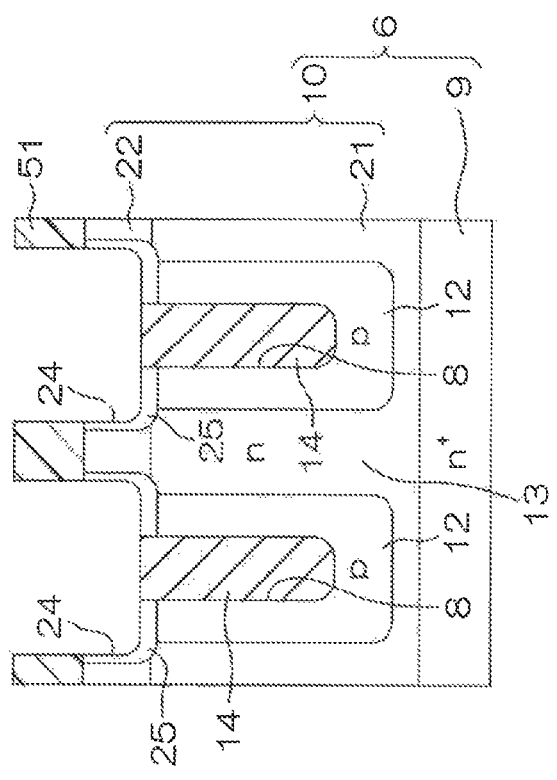

Next, as shown in FIGS. 14A and 14B, p-type impurities are injected onto the inner surface of each first surface trench (the lateral surface and the bottom portion of each first surface trench 24) using the hard mask 51 used when forming the first surface trench 24. At this time, the p-type impurities are injected onto the inner surface of each first surface trench 24 with a predetermined inclination angle with respect to the surface of the SiC epitaxial layer 10. Thereby, the first inner surface injection layer 25 is formed. The hard mask 51 is removed after the first inner surface injection layer 25 is formed.

Thereafter, as shown in FIGS. 8A and 8B, the anode electrode 17 is formed on the surface of the SiC epitaxial layer 10 and the cathode electrode 18 is formed on the rear surface of the SiC substrate 9. The Schottky barrier diode 2 is formed after the aforementioned steps are carried out.

As described above, according to the Schottky barrier diode 2, the n-type column region 13 has the second drift region 22 with a relatively low impurity concentration at the interface portion of Schottky junction. Therefore, it is possible to decrease the impurity concentration in the surface part of the SiC epitaxial layer 10, and thus it is possible to attenuate the intensity of the electric field applied to the surface of the epitaxial layer 10 when a reverse voltage is applied thereto. As a result, a leak current during the application of the reverse voltage can be reduced.

Further, according to the Schottky barrier diode 2, the first electric field attenuation region 23 is formed in the second drift layer 22. In the first electric field attenuation region 23, a pn junction portion is formed at the interface between the first inner surface injection layer 25 and the second drift layer 22. Therefore, a depletion layer is formed in the direction orthogonal to the depth direction of the trench 8 at the interface (pn junction portion) between the first inner surface injection layer 25 and the second drift layer 22. As such, it is possible to effectively attenuate the electric field intensity at the interface portion of Schottky junction.

FIGS. 15A and 15B are schematic cross-sectional views of a Schottky barrier diode 3 according to an embodiment of the present invention. The same reference numerals are applied to each part of FIGS. 15A and 15B corresponding to each part of FIGS. 3A and 3B and FIGS. 8A and 8B, and the description will be omitted.

As shown in FIG. 15B, a plurality of second electric field attenuation regions 26 is formed in the n-type column region 13. Each second electric field attenuation regions 26 includes a second surface trench 27 as an example of a second trench according to the present invention selectively formed in the surface part of the n-type column region 13, and a p-type second inner surface injection layer 28 formed in an annular shape in plan view so as to surround the second surface trench 27.

The second surface trenches 27 are formed spaced apart from each other along the stripe direction of the trench 8. The second surface trenches 27 are formed along the thickness direction from the surface of the SiC epitaxial layer 10 so that the bottom portion is positioned midway in the second drift layer 22. The bottom portion of each second surface trench 27 may cross the boundary between the first drift layer 21 and the second drift layer 22 to be positioned midway in the first drift layer 21. The edge portion between the lateral surface and the bottom portion of each second surface trench 27 is formed in a shape curved outward from the second surface trench 27. If the edge portion of each second surface trench 27 is formed in a curved shape, it is possible to attenuate the electric field concentrated at the edge portion. Further, each second surface trench 27 is made narrower than the width W2 of the n-type column region 13 along a direction orthogonal to the stripe direction, and is disposed at a position spaced apart from the boundary (pn junction portion) between the n-type column region 13 and each p-type column region 12.

The second inner surface injection layer 28 is formed along the inner surface (lateral surface and bottom portion) of the second surface trench 27. More specifically one surface and the other surface of the second inner surface injection layer 28 are formed along the lateral surface and the bottom surface of each second surface trench 27. The portion of the second inner surface injection layer 28 formed along the bottom portion of the second surface trench 27 is made thicker than the portion formed along the lateral surface of the second surface trench 27. The second inner surface injection layer 28 is formed to cross the boundary between the first drift layer 21 and the second drift layer 22 in the depth direction.

According to this embodiment, a pn junction portion is formed at the interface between the second inner surface injection layer 28 and the second drift layer 22 with a lower impurity concentration. Therefore, a depletion layer is formed in the direction orthogonal to the depth direction of the second surface trench 27 at the interface (pn junction portion) between the second inner surface injection layer 28 and the second drift layer 22. The second drift layer 22 that has a lower impurity concentration and the depletion layer in the second drift layer 22 contribute to the attenuation of the electric field intensity at the interface portion of the Schottky junction. In this way, a second electric field attenuation region 26 is formed.

Additionally, the width of the second electric field attenuation region 26 in the stripe direction is the same as the width W4 of the surface injection layer 16. Further, the width between each second electric field attenuation region 26 is the same as the width W5 between the surface injection layers 16.

The anode electrode 17 is formed to get into the second surface trench 27 from the surface of the SiC epitaxial layer 10. The anode electrode 17 getting into the second surface trench 27 is electrically connected to the second drift layer 22 and the n-type column region 13 through the second inner surface injection layer 28. The anode electrode 17 (lower layer electrode 17a) forms a Schottky junction with the n-type column region 13.

Next, a method for manufacturing the Schottky barrier diode 3 will be described.

FIGS. 16A and 16B to 21A and 21B are views illustrating part of manufacturing steps of the Schottky barrier diode 3 shown in FIGS. 15A and 15B, respectively.

First, the n$^+$ type SiC substrate 9 is prepared as shown in FIGS. 16A and 16B. Next, SiC grows epitaxially while n-type impurities are selectively injected so that the n-type SiC epitaxial layer 10 including the first drift layer 21 and the second drift layer 22 in this order is formed on the SiC substrate 9.

Next, as shown in FIGS. 17A and 17B, the trench 8 is formed after the same steps as those shown in FIGS. 5A and 5B are carried out. At this time, the bottom portion of each trench 8 is formed in the first drift layer 21 at a midway position along the depth direction.

Next, as shown in FIGS. 18A and 18B, the p-type column region 12 and the n-type column region 13 are formed after the same steps as those shown in FIGS. 6A and 6B are carried out.

Next, as shown in FIGS. 19A and 19B, the insulating film 14 is embedded in each trench 8 after the same steps as those shown in FIGS. 7A and 7B are carried out.

Next, as shown in FIGS. 20A and 20B, a hard mask 52 is formed, which has an opening selectively formed in a region where the second surface trench 27 is to be formed. Then, the second surface trenches 27 is formed by etching through the hard mask 52. At this time, the bottom portion of the second surface trench 27 may be formed in the second drift layer 22 at a midway position along the depth direction or may be formed in the first drift layer 21 at a midway position along the depth direction after passing through the second drift layer 22.

Figure 21B:
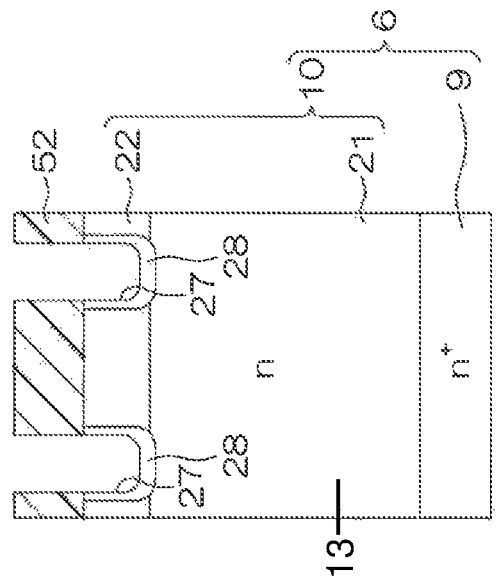
FIGS. 21A and 21B are views illustrating the steps following the steps shown in FIGS. 20A and 20B.
Figure 21A:
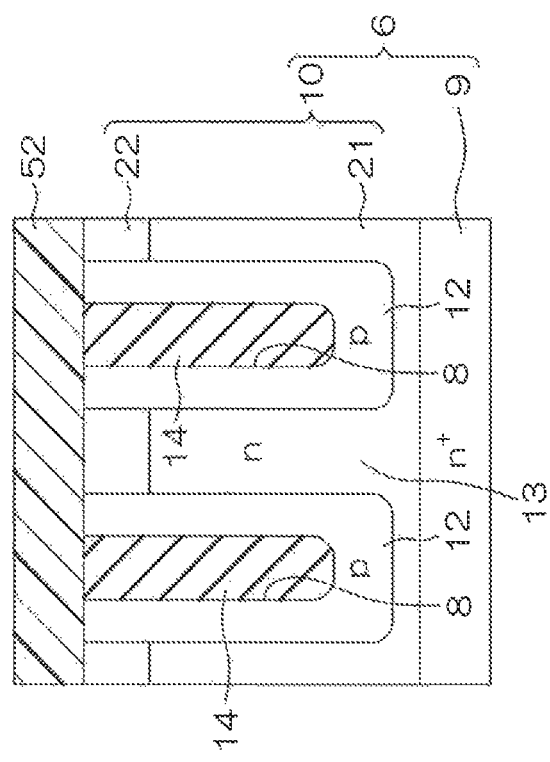

Next, as shown in FIGS. 21A and 21B, p-type impurities are injected onto the inner surface of each second surface trench (the lateral surface and the bottom portion of each second surface trench 27) using the hard mask 52 used when forming the second surface trench 27. At this time, the p-type impurities are injected onto the inner surface of each second surface trench 27 with a predetermined inclination angle with respect to the surface of the SiC epitaxial layer 10. Thereby, the second inner surface injection layer 28 is formed. The hard mask 52 is removed after the second inner surface injection layer 28 is formed.

Thereafter, as shown in FIGS. 15A and 15B, the anode electrode 17 is formed on the surface of the SiC epitaxial layer 10 and the cathode electrode 18 is formed on the rear surface of the SiC substrate 9. The Schottky barrier diode 3 is formed after the aforementioned steps are carried out.

As described above, according to the Schottky barrier diode 3, a second electric field attenuation region 26 is formed in the second drift layer 22. In the second electric field attenuation region 26, a pn junction portion is formed at the interface between the second inner surface injection layer 28 and the second drift layer 22. Therefore, a depletion layer is formed in a direction orthogonal to the depth direction of the trench 8 at the interface (pn junction portion) between the second inner surface injection layer 28 and the second drift layer 22. As such, it is possible to effectively attenuate the electric field intensity at the interface portion of Schottky junction.

Further, it is possible to manufacture a schottky barrier diode including the first electric field attenuation region 23 and the second electric field attenuation region 26 by combining the configuration of the Schottky barrier diode 3 and the configuration of the Schottky barrier diode 2. According to such a configuration, it is possible to further improve electric field intensity attenuation performance at the interface of Schottky junction.

In this case, in steps shown in FIGS. 20A and 20B, a hard mask is formed in place of the hard mask 52, which has openings selectively formed in a region where the first surface trench 24 is to be formed in addition to a region where the second surface trench 27 is to be formed. Next, the first surface trench 24 and he second surface trench 27 are formed by etching through the hard mask.

Next p-type impurities are injected onto the inner surfaces of the first surface trench 24 and the second surface trench 27 using the hard mask in the same manner as steps shown in FIGS. 21A and 21B. Thereby, the first electric field attenuation region 23 and the second electric field attenuation region 26 can be formed.

Figure 22B:
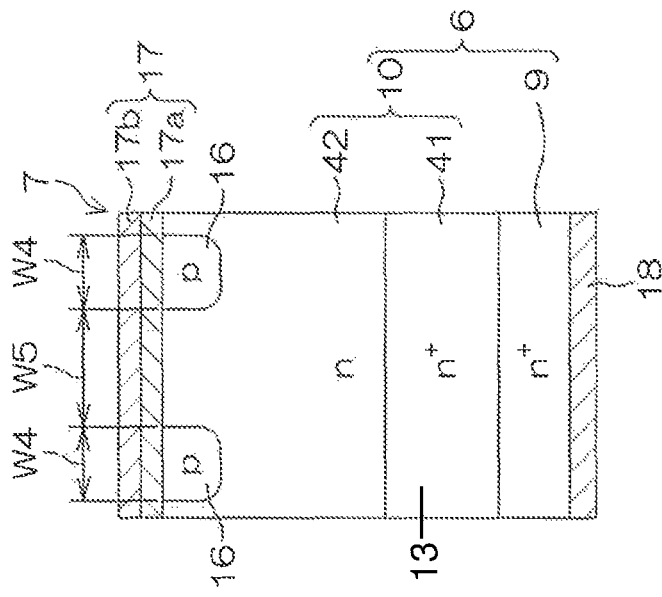
FIGS. 22A and 22B are schematic cross-sectional views of a Schottky barrier diode according to an embodiment of the present invention.
Figure 22A:
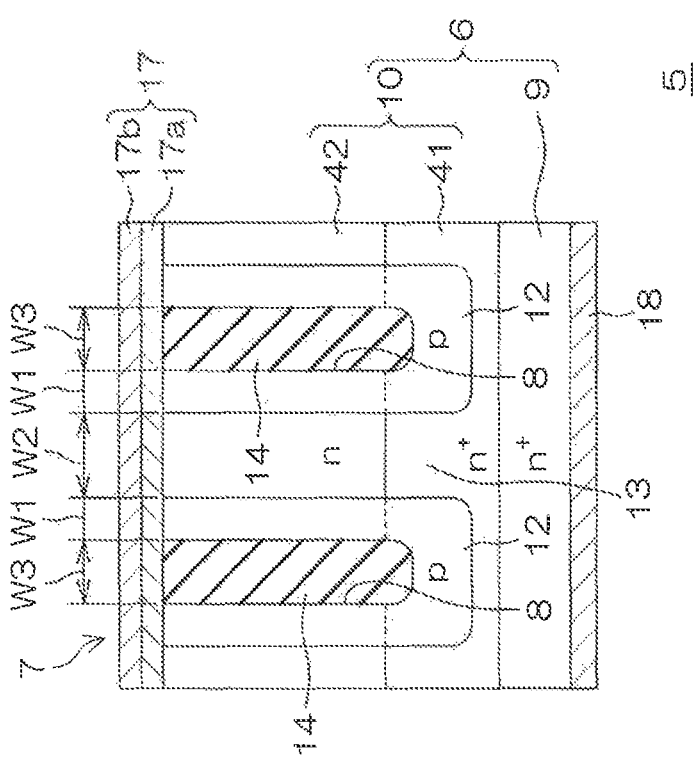

FIGS. 22A and 22B are schematic cross-sectional views of a Schottky barrier diode 4 according to an embodiment of the present invention. The same reference numerals are applied to each part of FIGS. 22A and 22B corresponding to each part of FIGS. 3A and 3B, and the description will be omitted.

The SiC epitaxial layer 10 has a concentration profile in which the impurity concentration increases along the thickness direction from the surface thereof. The concentration profile of the SiC epitaxial layer 10 may be formed by a structure in which a plurality of impurity regions having different impurity concentrations is laminated. In this embodiment, an example is shown in which the SiC epitaxial layer 10 includes an n$^+$ type high concentration region 41 and n-type low concentration region 42.

The high concentration region 41, which has an impurity concentration lower than the SiC substrate 9, is formed on the SiC substrate 9. The high concentration region 41 preferably has an impurity concentration higher than or (approximately) equal to the impurity concentration in the p-type column region 12 (that is: the impurity concentration in the high concentration region 41 the impurity concentration in the p-type column region 12). The low concentration region 42 is formed on the high concentration region 41 and has an impurity concentration lower than the impurity concentration in the high concentration region 41. The impurity concentration in the high concentration region 41 is, for example, $1 \times 10^{16}$ cm$^{-3}$ to $1 \times 10^{19}$ cm$^{-3}$. Whereas, the impurity concentration in the low concentration region 42 is, for example, $5 \times 10^{14}$ cm$^{-3}$ to $5 \times 10^{17}$ cm$^{-3}$.

The trench 8 is formed so that the bottom portion is positioned midway in the high concentration region 41. The p-type column region 12 along the bottom portion of the trench 8 is formed in the high concentration region 41. In FIGS. 22A and 22B, an example is shown in which the portions of the p-type column region 12 formed along part of the lateral surface, the edge portion, and the bottom portion of the trench 8 are formed in the high concentration region 41. The p-type column region 12 may be formed so that at least the portions thereof formed along the bottom portion and the edge portion of the trench 8 are formed in the high concentration region 41.

The n-type column region 13 according to this embodiment is constituted by the high concentration region 41 and the low concentration region 42 as part of the SiC epitaxial layer 10.

Such a schottky barrier diode 4 can be manufactured by carrying out the steps shown in FIGS. 23A and 23B to FIGS. 25A and 25B in place of the steps shown in FIGS. 4A and 4B. FIGS. 23A and 23B to FIGS. 25A and 25B are views illustrating part of the manufacturing steps of the schottky barrier diode 4 shown in FIGS. 22A and 22B.

Figure 23A:
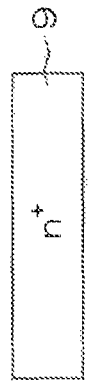
FIGS. 23A and 23B are views illustrating part of manufacturing steps of the Schottky barrier diode shown in FIGS. 22A and 22B.
Figure 23B:
Figure 24A:
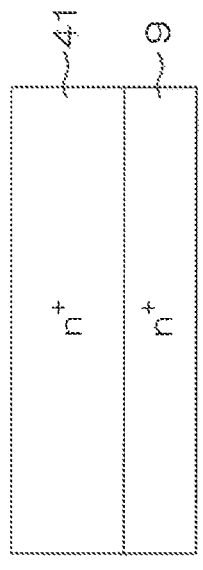
FIGS. 24A and 24B are views illustrating the steps following the steps shown in FIGS. 23A and 23B.
Figure 24B:
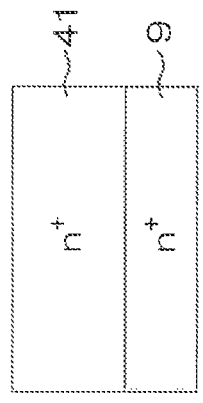

First, the n$^+$ type SiC substrate 9 is prepared as shown in FIGS. 23A and 23B. Next, SiC grows epitaxially while n-type impurities (for example, nitrogen (N)) are selectively injected so that the high concentration region 41 is formed on the SiC substrate 9.

Figure 25A:
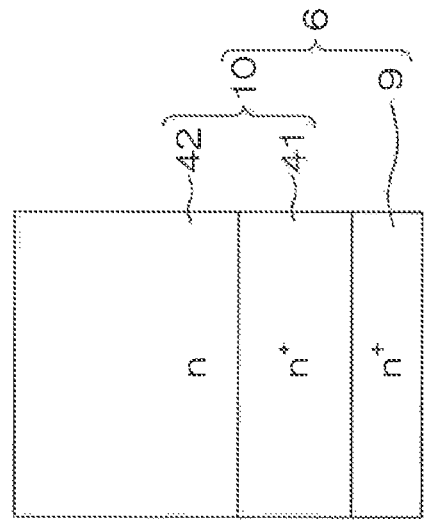
FIGS. 25A and 25B are views illustrating the steps following the steps shown in FIGS. 24A and 24B.
Figure 25B:
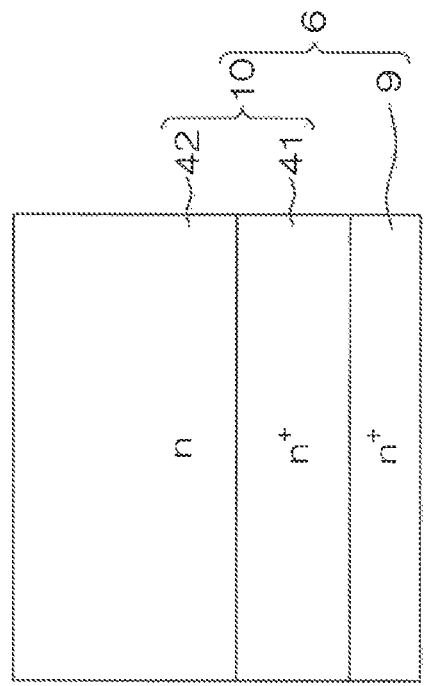

Next, as shown in FIGS. 25A and 25B, SiC grows epitaxially while the same n-type impurities as the high concentration region 41 are selectively injected so that the low concentration region 42 is formed on the high concentration region 41. Thereby, the epitaxial layer 10 including the high concentration region 41 and the low concentration region 42 is formed. Thereafter, the Schottky barrier diode 4 is formed after the same steps as those shown in FIGS. 5A and 5B to FIGS. 7A and 7B are carried out.

The electric field formed by the p-type column region 12 along the inner surface of the trench 8 is preferably uniformed along the depth direction of the trench 8. However, when the p-type column region 12 is formed by injecting impurities onto the inner surface of the trench 8, the impurity concentration in the p-type column region 12 along the bottom portion of the trench 8 might be made relatively high.

Here, when the SiC epitaxial layer 10 is formed having a uniform concentration, the electric field formed by the p-type column region 12 along the bottom portion of the trench 8 becomes higher than the electric field formed by the p-type column region 12 along the lateral surface of the trench 8. Therefore, electric field might be concentrated at the bottom portion and the edge portion of the trench 8.

According to the Schottky barrier diode 4, the SiC epitaxial layer 10 is formed to have a concentration profile in which an impurity concentration increases along the thickness direction from the surface thereof. Further, the p-type column region 12 along the bottom portion of the trench 8 is formed in the high concentration region 41 in which the impurity concentration is higher than the impurity concentration in the low concentration region 42. Additionally, the high concentration region 41 has an impurity concentration that is higher than or (approximately) equal to the impurity concentration in the p-type column region 12.

Thereby, the p-type column region 12 in the high concentration region 41 can be recognized substantially as part of the high concentration region 41, and thus it is possible to effectively suppress an increase in the electric field formed by the p-type column region 12 along the bottom portion of the trench 8. As a result, even if a high impurity concentration is formed in the p-type column region 12 at the bottom portion and the edge portion of the trench 8, the electric field concentration at the bottom portion and the edge portion of the trench 8 can be effectively attenuated.

Further, the impurity concentration and thickness of the high concentration region 41 and the low concentration region 42 can be accurately controlled by utilizing the property of SiC that impurities are hardly diffused therein. Additionally, even if activation (for example, annealing described in FIGS. 6A and 6B) is carried out after ion injection, the impurities in the high concentration region 41 and the low concentration region 42 cannot be widely diffused in the SiC epitaxial layer 10. Consequently, the SiC epitaxial layer 10 with a desired concentration profile can be formed.

In the aforementioned embodiments shown in FIGS. 8A and 8B and FIGS. 15A and 15B, of course, the configuration of the SiC epitaxial layer 10, which further includes the high concentration region 41 and the low concentration region 42, may be adopted by carrying out the steps shown in FIGS. 23A and 23B to 25A and 25B.

As described above, although embodiments according to the present invention have been described, it is possible to practice the present invention in other embodiments.

For example, in relation to the thickness of the p-type column region 12 in each embodiment described above, the thickness of the portion formed along the lateral surface of each trench 8 may be the same as the thickness of the portion formed along the bottom portion of each trench 8.

Further, in relation to the thickness of the first inner surface injection layer 25 in the embodiment shown in FIGS. 8A and 8B, the thickness of the portion formed along the bottom portion of the first trench 24 may be the same as the thickness of the portion formed along the lateral surface of the first trench 24.

Further, in relation to the thickness of the second inner surface injection layer 28 in the embodiment shown in FIGS. 15A and 15B, the thickness of the portion formed along the bottom portion of the second trench 27 may be the same as the thickness of the portion formed along the lateral surface of the second trench 27.

Further, in each embodiment described above, although examples are described in which vertical trenches 8, 24, and 27 are formed with respect to the surface of the SiC epitaxial layer 10, the trenches 8, 24, and 27 may be formed in a trapezoidal shape (tapered shape) in cross-sectional view in which the opening width becomes narrower from the opening toward the bottom portion.

Further, in each step shown in FIGS. 5A and 5B, FIGS. 10A and 10B, and FIGS. 17A and 17B in each embodiment described above, the trench 8 may be further dug using the hard mask 50 prior to annealing after injecting p-type impurities onto the inner surface of the trench 8. Thereby, the p-type impurities injected onto the bottom portion of the trench 8 is removed and the p-type column region 12 along the lateral surface of the trench 8 can be formed in the subsequent annealing.

Further, in each embodiment described above, a configuration may be adopted in which the conductivity type of each semiconductor portion is reversed. That is, in each embodiment described above, a p-type portion may be replaced by an n-type portion and vice versa.

The Schottky diodes 1 to 4 according to the present invention can be incorporated in a power module that can be used in an inverter circuit constituting a drive circuit for driving electric motors that are used as a power source, for example, in electric cars (hybrid cars included), trains, and industrial robots. Also these diodes can be incorporated in a power module that can be used in an inverter circuit, which converts power generated by solar batteries, wind power generators, and other power generators (in particular private power generators) so as to conform with the power from a commercial power supply.

It is to be understood that variations and modifications can be made without departing from the scope and spirit of the present invention.

This application corresponds to Patent Application No. 2014-098911 submitted to Japanese Patent Office on May 12, 2014, and the entire contents of this application are hereby incorporated by reference.

DESCRIPTION OF THE REFERENCE NUMERALS

1 Schottky barrier diode
2 Schottky barrier diode
3 Schottky barrier diode
4 Schottky barrier diode
6 SiC semiconductor layer
8 Trench
12 p-type column region
13 n-type column region
14 Insulating film
16 Surface injection layer
17 Anode electrode
23 First electric field attenuation region
24 First surface trench
25 First inner surface injection layer
26 Second electric field attenuation region
27 Second surface trench
28 Second inner surface injection layer
41 High concentration region
W1 Width of p-type column region
W2 Width of n-type column region
W3 Width of trench

What is claimed is:

1. A semiconductor device comprising:
    a semiconductor layer made of a first conductivity type SiC;
    a plurality of second conductivity type column regions formed in a surface side of the semiconductor layer;
    a first conductivity type column region arranged between the second conductivity type column regions adjacent to each other;
    a second conductivity type surface injection layer formed in a surface part of the first conductivity type column region such that the second conductivity type surface injection layer having a depth shallower than the second conductivity type column region and connecting between the second conductivity type column regions adjacent to each other;
    an anode electrode electrically connected to the second conductivity type column region and forming a Schottky junction with the first conductivity type column region; and
    a cathode electrode formed on a rear surface side of the semiconductor layer.

2. The semiconductor device according to claim 1, further comprising:
    a plurality of trenches formed in the semiconductor layer; and
    an insulating film embedded in a respective one of the plurality of trenches, wherein
    each second conductivity type column region is formed along an inner surface of the respective one of the plurality of trenches.

3. The semiconductor device according to claim 2, wherein
    the second conductivity type column region is formed such that one surface and the other surface of the second conductivity type column region are formed along the inner surface of the trenches.

4. The semiconductor device according to claim 2, wherein a relational expression: $W2 \leq W1+W1+W3$ is satisfied in a direction along a surface of the semiconductor layer, wherein $W2$ represents a width of the first conductivity type column region; $W1$ represents each width of the second conductivity type column regions on both sides of the first conductivity type column region; and $W3$ represents a width of the trench.

5. The semiconductor device according to claim 2, wherein the insulating film is composed of a material having a relative permittivity lower than SiC.

6. The semiconductor device according to claim 5, wherein the insulating film is composed of $SiO_2$.

7. The semiconductor device according to claim 2, wherein
    the semiconductor layer includes a concentration profile in which an impurity concentration becomes higher from a surface along a depth direction of the trench, and
    the second conductivity type column region along a bottom portion of the trench is formed in a high concentration region in which the impurity concentration is higher than a surface part in the semiconductor layer.

8. The semiconductor device according to claim 7, wherein the impurity concentration in the high concentration region is higher than or equal to the impurity concentration in the second conductivity type column region.

9. The semiconductor device according to claim 1, wherein the plurality of second conductivity type column regions are formed in a central region of the semiconductor layer with stripe shapes.

10. The semiconductor device according to claim 1, wherein a plurality of the second conductivity type surface injection layers are formed spaced apart from each other.

11. The semiconductor device according to claim 1, wherein
- the first conductivity type column region has a low concentration region at an interface portion of the Schottky junction, and
- the impurity concentration of the low concentration region is lower than that of a portion under the interface portion.

12. The semiconductor device according to claim 1, further comprising an electric field attenuation portion selectively formed in the surface part of the first conductivity type column region for attenuating an electric field intensity in the surface part.

13. The semiconductor device according to claim 12, wherein the electric attenuation portion includes
- a second trench selectively formed in the surface part of the first conductivity type column region, and
- a second conductivity type inner surface injection layer formed by impurity injection onto an inner surface of a second trench.

* * * * *